United States Patent
Zhang et al.

(10) Patent No.: US 11,627,673 B2
(45) Date of Patent: Apr. 11, 2023

(54) DISPLAY DEVICE

(71) Applicant: Shanghai Tianma Micro-Electronics Co., Ltd., Shanghai (CN)

(72) Inventors: Xiaoyin Zhang, Shanghai (CN); Shaorong Yu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 17/513,370

(22) Filed: Oct. 28, 2021

(65) Prior Publication Data

US 2022/0053650 A1     Feb. 17, 2022

(30) Foreign Application Priority Data

Jun. 30, 2021    (CN) .......................... 202110736655.5

(51) Int. Cl.
*H05K 5/00*     (2006.01)
*H05K 5/02*     (2006.01)

(52) U.S. Cl.
CPC ......... *H05K 5/0021* (2013.01); *H05K 5/0017* (2013.01); *H05K 5/0217* (2013.01)

(58) Field of Classification Search
USPC ................................ 361/731, 807, 809, 810
See application file for complete search history.

(56) References Cited

U.S. PATENT DOCUMENTS

| 10,753,531 B2* | 8/2020 | Huang ................... F16M 11/08 |
| 2021/0312839 A1* | 10/2021 | Cheng .................... G09F 9/3026 |
| 2022/0053652 A1* | 2/2022 | Chen ................... F16M 11/2014 |

FOREIGN PATENT DOCUMENTS

| CN | 103050064 A | 4/2013 |
| CN | 205810282 U | 12/2016 |

* cited by examiner

*Primary Examiner* — Hung S. Bui
(74) *Attorney, Agent, or Firm* — KDW Firm PLLC

(57) ABSTRACT

Provided is a display device, which relates to a field of display technologies. The display device includes multiple display screen units and multiple support units. The multiple support units are configured to support the multiple display screen unit. Each of the multiple support units includes a support portion, where the support includes a first support portion and a second support portion, where the first support portion extends in a first direction, the second support portion extends in a second direction, and the first direction intersects the second direction; two support units connected in the first direction of the multiple support units are rotatable relative to each other with the second direction as a rotation axis direction, and two support units connected in the second direction of the multiple support units are rotatable relative to each other with the first direction as a rotation axis direction.

19 Claims, 20 Drawing Sheets

DISPLAY DEVICE

CROSS-REFERENCE TO RELATED APPLICATION(S)

This application claims priority to Chinese patent application No. 202110736655.5 filed Jun. 30, 2021, the disclosure of which is incorporated herein by reference in its entirety.

TECHNICAL FIELD

The present disclosure relates to the field of display technologies and, in particular, to a display device.

BACKGROUND

At present, the large-size display screen is usually spliced by multiple splicing units, but the connection strength between various splicing units is limited, so it is difficult to ensure the splicing reliability of the whole display screen.

To solve this problem, a current solution in the industry is to provide one or more support frames for supporting the splicing units.

SUMMARY

The present disclosure provides a display device to adjust the display angle of each display screen unit in two intersecting directions.

An embodiment of the present disclosure provides a display device. The display device includes multiple display screen units and multiple support units.

The multiple support units are configured to support the multiple display screen units; where two support units connected in a first direction of the multiple support units are rotatable relative to each other with a second direction as a rotation axis direction, and the first direction intersects the second direction.

DETAILED DESCRIPTION

Figure 1:
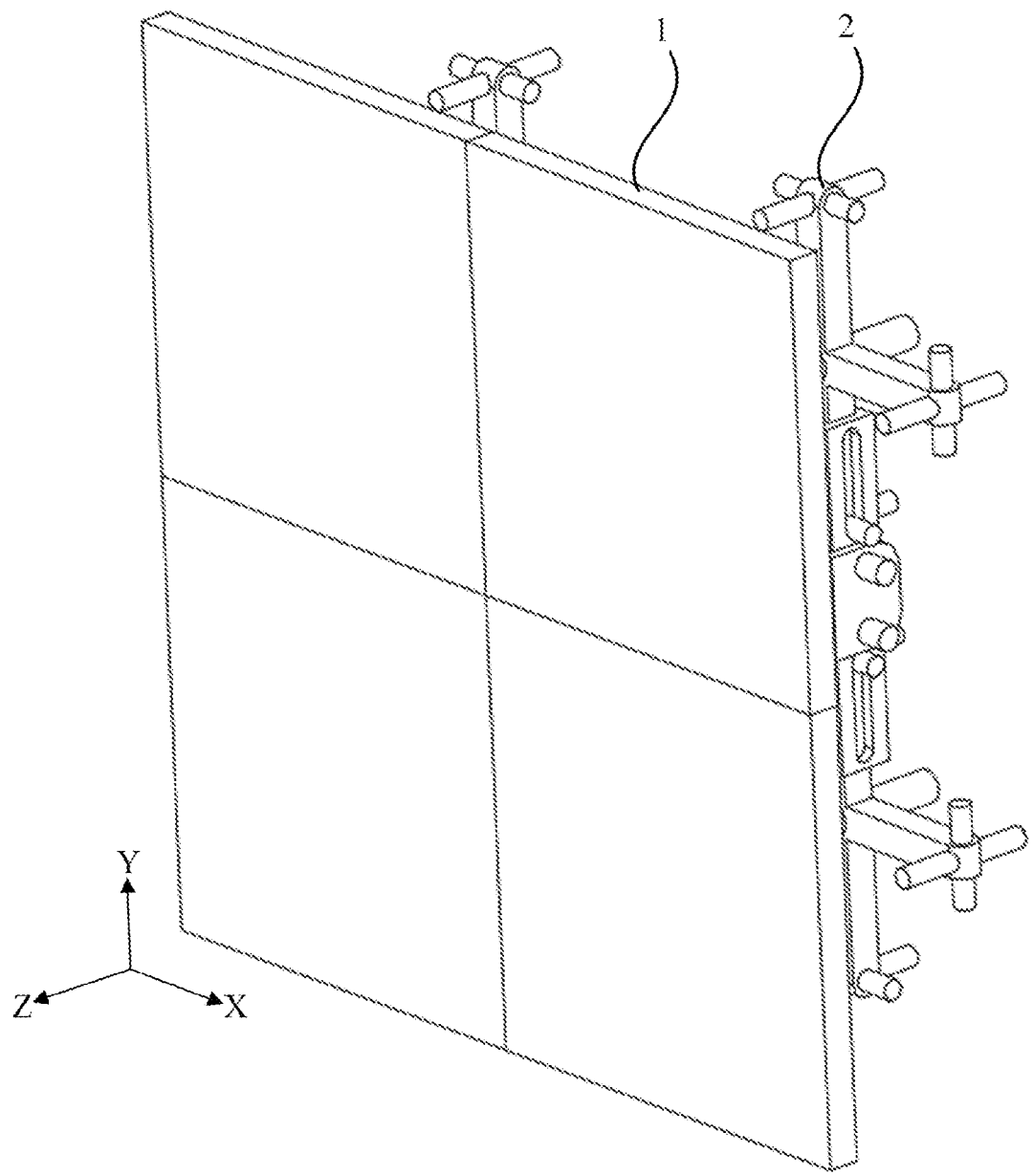
FIG. 1 is a schematic diagram of a display device in a frontal oblique viewing angle according to an embodiment of the present disclosure.

The present disclosure is further described hereinafter in detail in conjunction with drawings and embodiments. It is to be understood that embodiments described hereinafter are intended to explain the present disclosure and not to limit the present disclosure. Additionally, it is to be noted that for ease of description, only part, not all, of structures related to the present disclosure are illustrated in the drawings.

Figure 2:
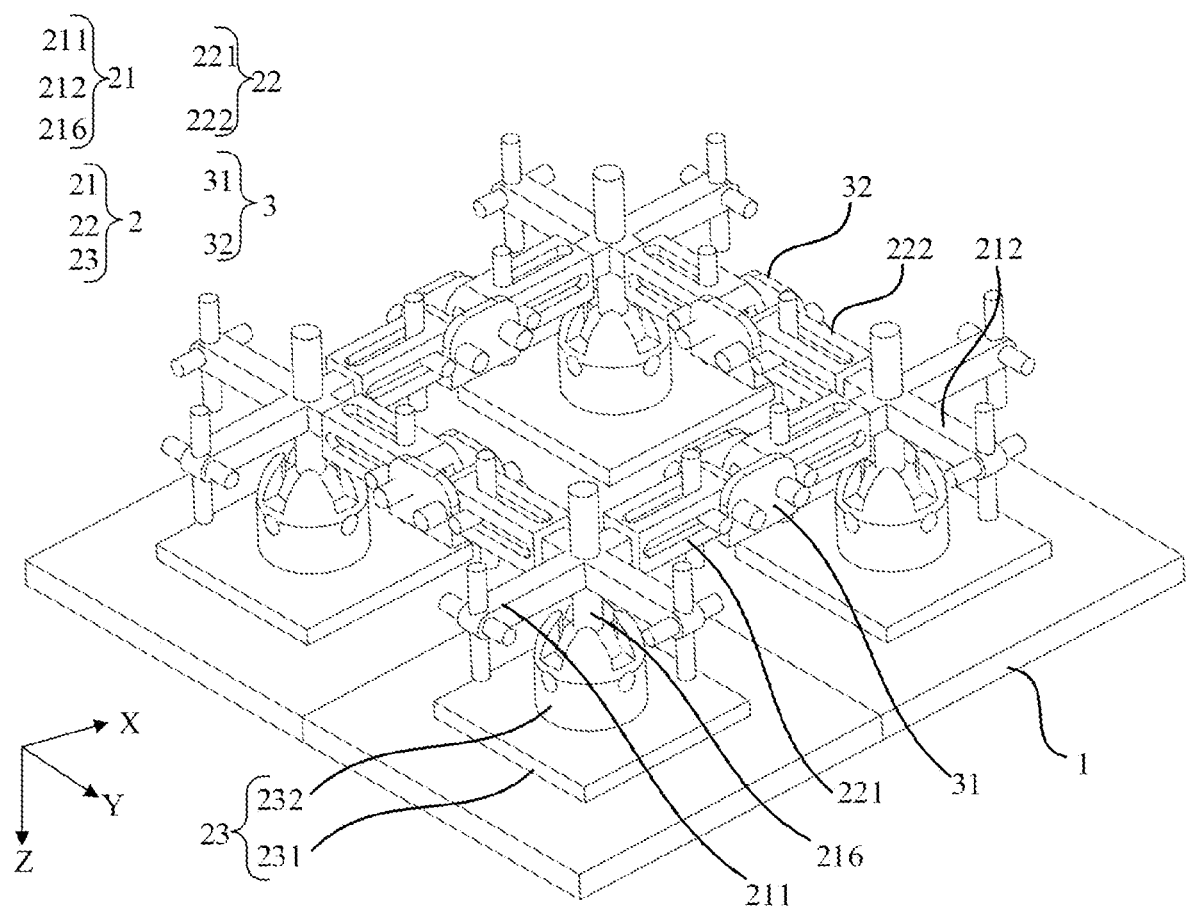
FIG. 2 is a schematic diagram of a display device shown in FIG. 1 in a rear oblique viewing angle.
Figure 3:
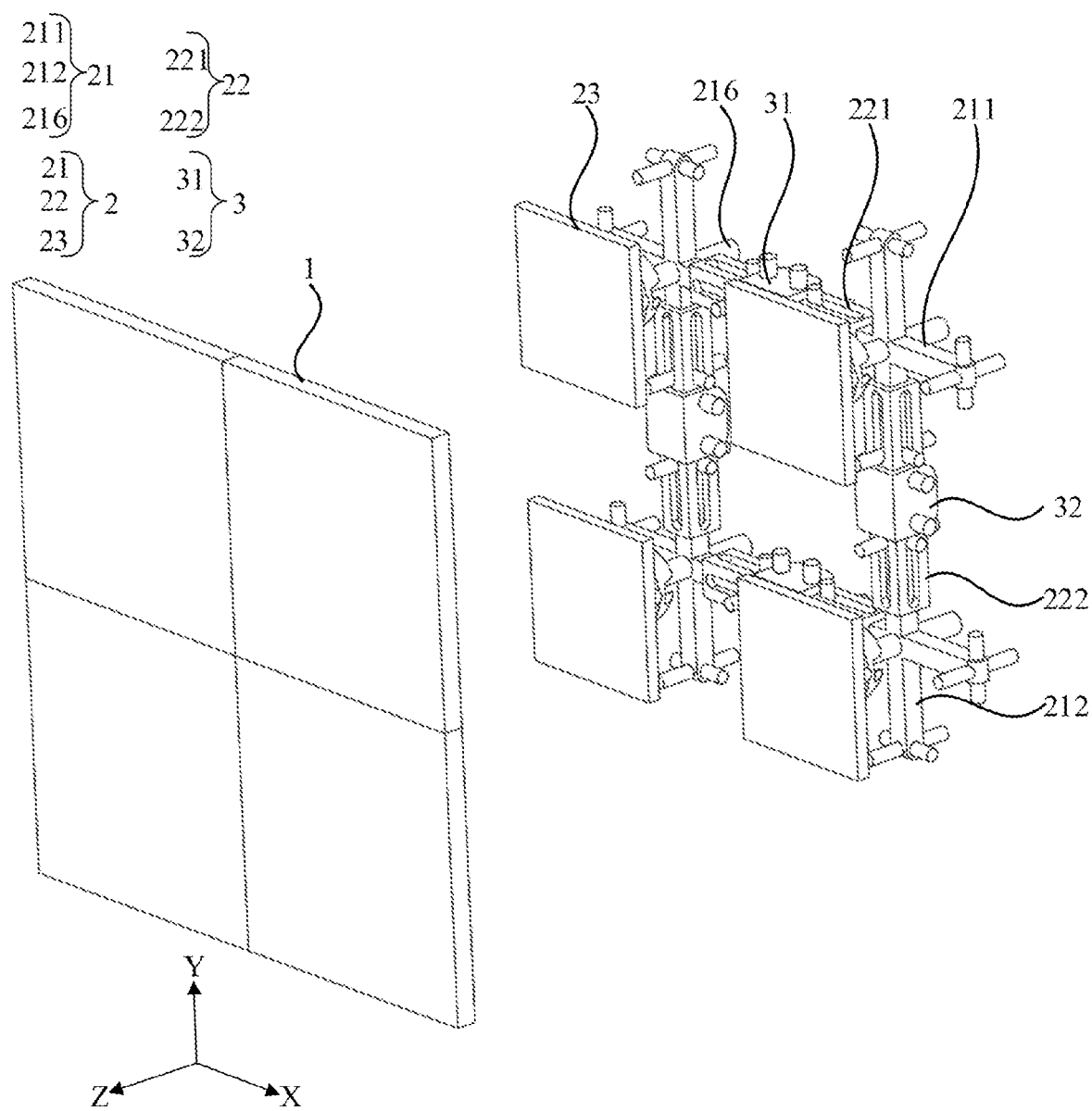
FIG. 3 is an exploded diagram of a display device shown in FIG. 1 in a frontal oblique viewing angle.
Figure 4:
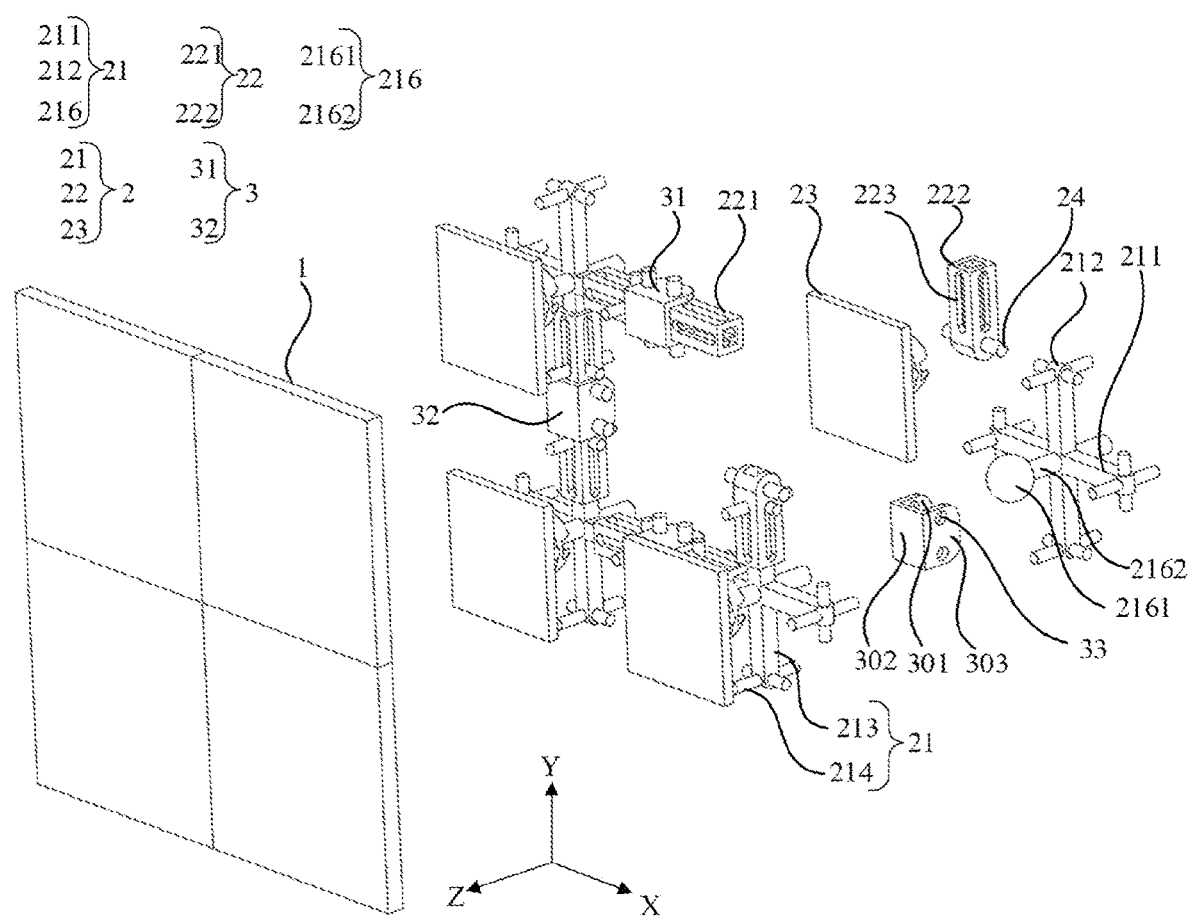
FIG. 4 is an exploded diagram of the display device shown in FIG. 1.
Figure 5:
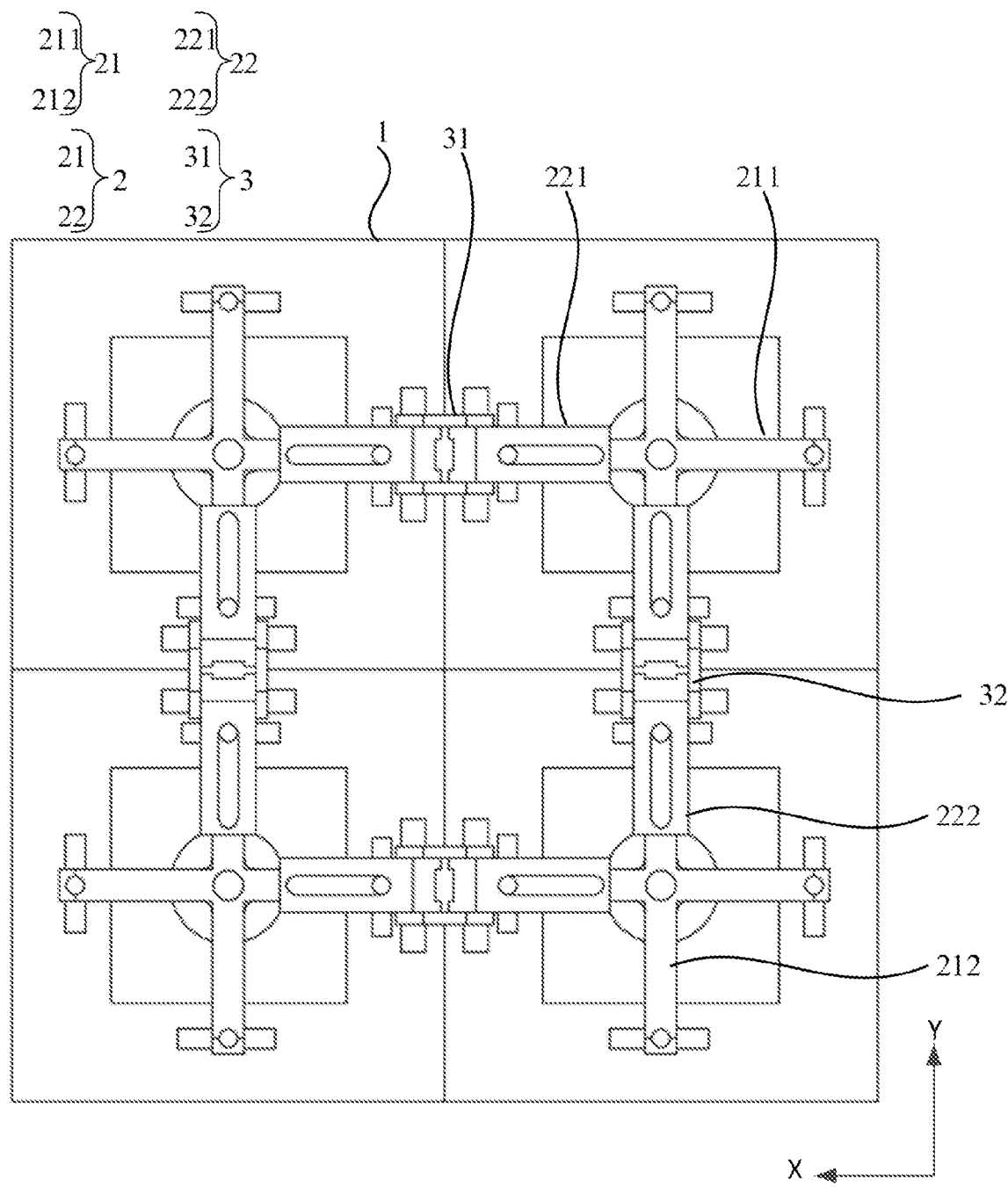
FIG. 5 is a rear schematic diagram of a display device shown in FIG. 1.
Figure 6:
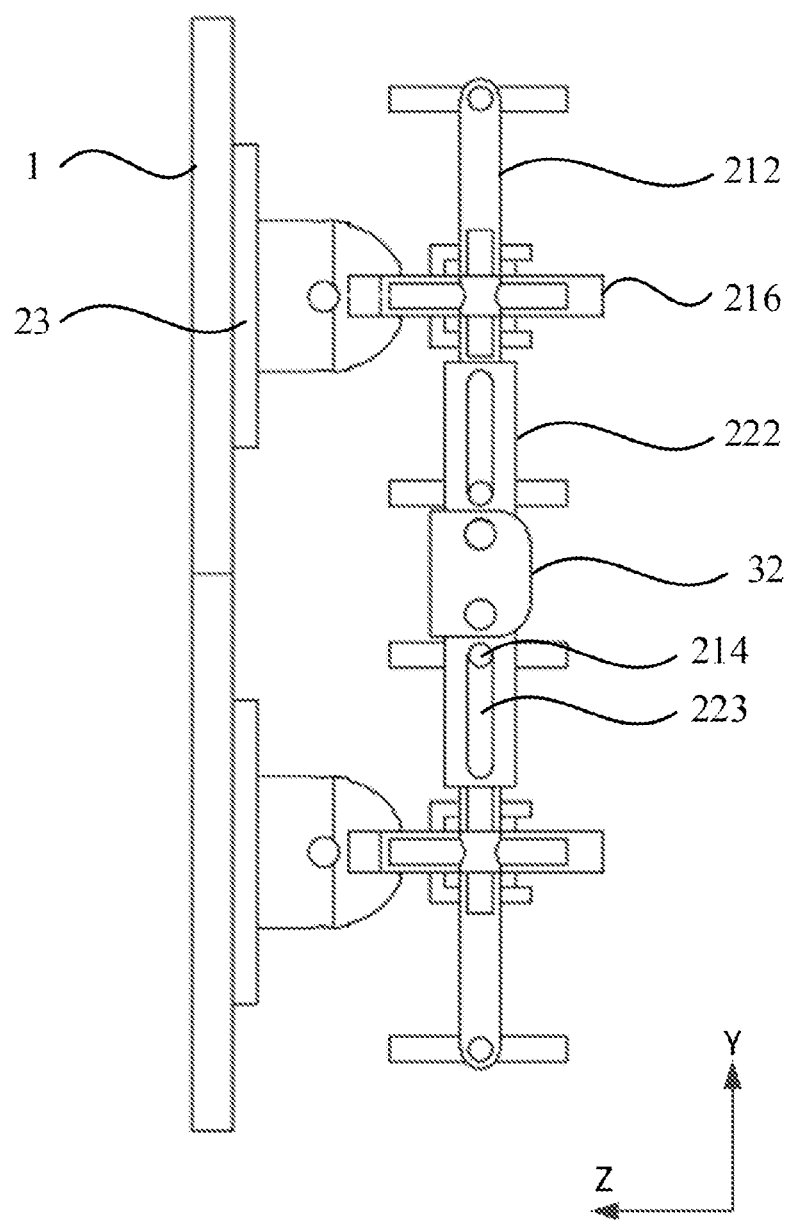
FIG. 6 is a side schematic diagram of a display device shown in FIG. 1.
Figure 7:
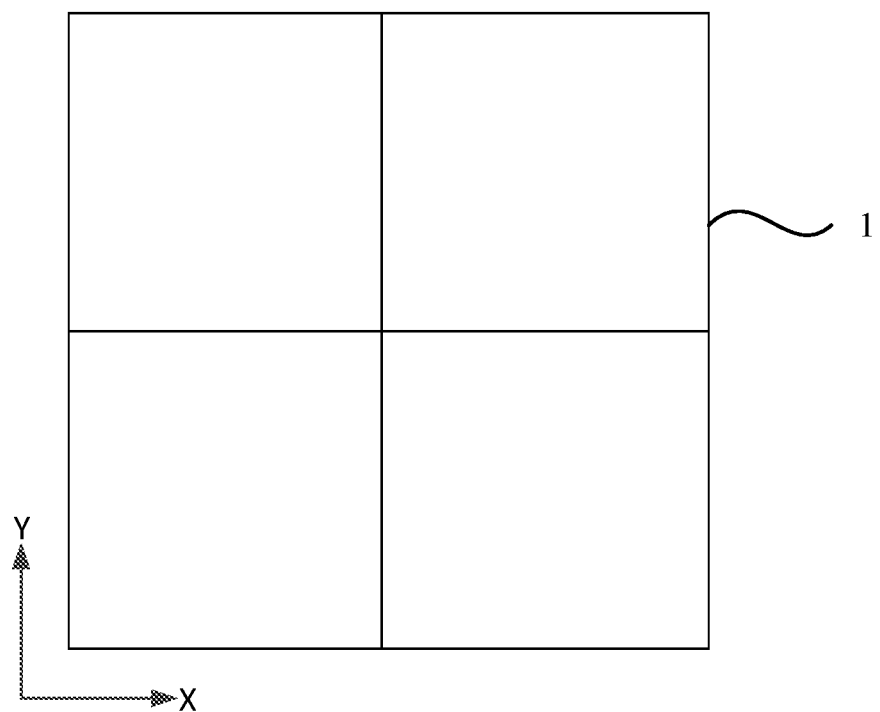
FIG. 7 is a front schematic diagram of a display device shown in FIG. 1.

FIG. 1 is a schematic diagram of a display device in a frontal oblique viewing angle according to an embodiment of the present disclosure. FIG. 2 is a schematic diagram of a display device shown in FIG. 1 in a rear oblique viewing angle. FIG. 3 is an exploded diagram of a display device shown in FIG. 1 in a frontal oblique viewing angle. FIG. 4 is an exploded diagram of the display device shown in FIG. 1. FIG. 5 is a rear schematic diagram of a display device shown in FIG. 1. FIG. 6 is a side schematic diagram of a display device shown in FIG. 1. FIG. 7 is a front schematic diagram of a display device shown in FIG. 1. Referring to FIGS. 1 to 7, the display device includes multiple display screen units 1 and multiple support units 2. The display screen unit 1 is used for displaying an image, and may include, for example, an organic light-emitting display panel, a liquid crystal display panel, a quantum dot display panel, a micro light-emitting diode display panel and the like. The support unit 2 is used for supporting the display screen unit 1. The support unit 2 includes a support portion 21. The support portion 21 includes a first support portion 211 and a second support portion 212. The first support portion 211 extends in a first direction X and the second support portion 212 extends in a second direction Y. The first direction X intersects the second direction Y. In an embodiment, the first direction X and the second direction Y may be perpendicular to each other. In another embodiment, the first direction X and the second direction Y may not be perpendicular to each other and have an included angle greater than 0° and less than 90°.

Figure 8:
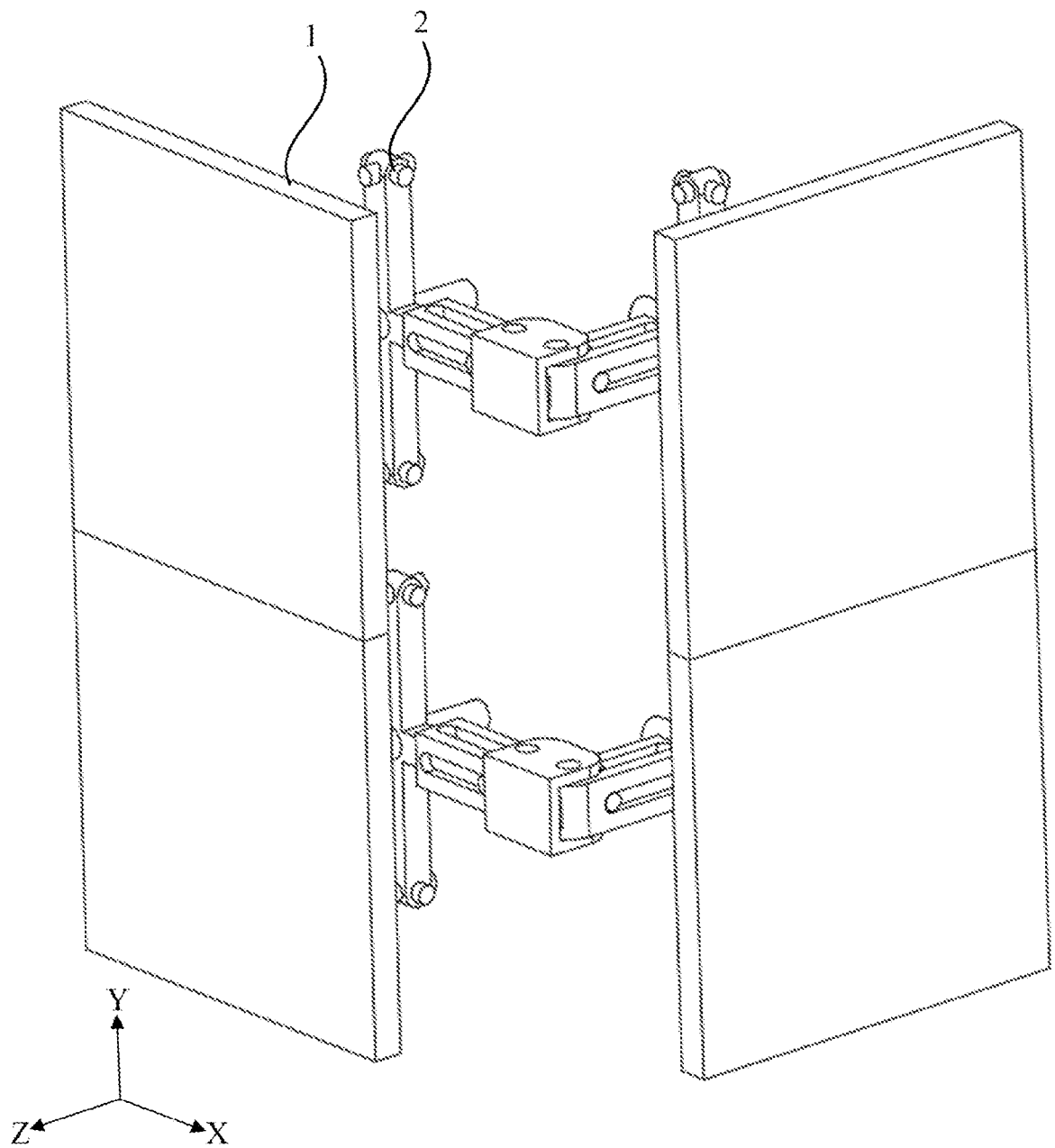
FIG. 8 is a schematic diagram of two support units which are connected in a first direction after rotating by taking a second direction as a rotation axis direction in the display device shown in FIG. 1.
Figure 9:
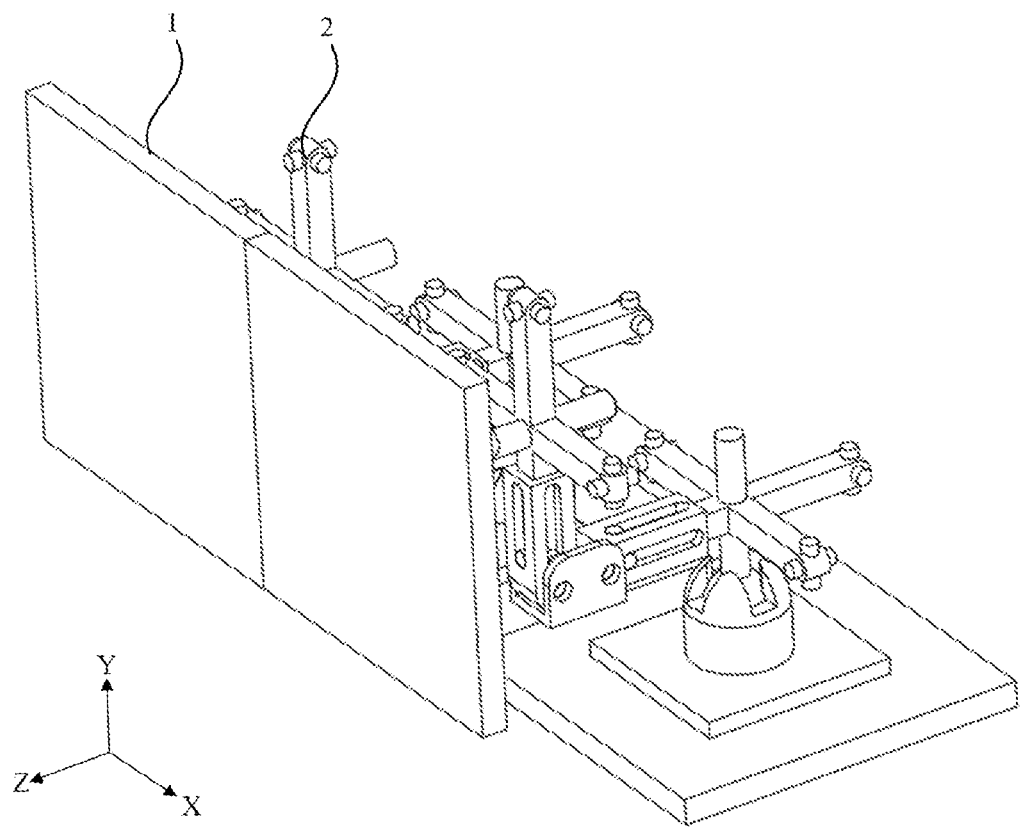
FIG. 9 is a schematic diagram of two support units which are connected in a second direction after rotating by taking a first direction as a rotation axis direction in the display device shown in FIG. 1.

FIG. 8 is a schematic diagram of two support units which are connected in a first direction after rotating by taking a second direction as a rotation axis direction in the display device shown in FIG. 1. Referring to FIGS. 1 to 8, taking the second direction Y as the rotation axis direction, the two support units 2 which are connected in the first direction X are able to rotate relative to each other. FIG. 9 is a schematic diagram of two support units which are connected in a second direction after rotating by taking a first direction as a rotation axis direction in the display device shown in FIG. 1. Referring to FIG. 9, taking the first direction X as the rotation axis direction, the two support units 2 which are connected in the second direction Y are able to rotate relative to each other. It is to be noted that, since the two support units 2 which are connected in the first direction X, after rotating by taking the second direction Y as the rotation axis direction, are able to rotate relative to each other, an extension direction of the first support portion 211 which initially extends in the first direction X may be changed. In the embodiments of the present disclosure, the first support portion 211 extending in the first direction X means that the first support portion 211 extends in the first direction X in a case where various display panel unit 1 are located in a same plane. Similarly, since the two support units 2 which are connected in the second direction Y, after rotating by taking the first direction X as the rotation axis direction, are able to rotate relative to each other, an extension direction of the second support portion 212 which initially extends in the second direction Y may be changed. In the embodiments of the present disclosure, the second support portion 212 extending in the second direction Y means that the second support portion 212 extends in the second direction Y in a case where various display panel unit 1 are located in the same plane.

The embodiments of the present disclosure provide a display device. The display device includes multiple display screen units 1 and multiple support units 2. One support unit 2 supports one display screen unit 1, or one support unit 2 supports multiple display screen units 1. A support portion 21 includes a first support portion 211 and a second support portion 212. The first support portions 211 of adjacent two support units 2 of the multiple support units are connected in the first direction X. After the two support units 2 rotate by taking the second direction Y as the rotation axis direction, an extension direction 211 of the first support of at least one support unit 2 may be no longer along the first direction X, and the extension directions of the first support portions 211 of the adjacent two support units 2 intersect, so that the display device can adjust the display angle of each display screen unit 1 on the direction X. The second support portions 212 of adjacent two support units 2 of the multiple support units are connected in the second direction Y. After the two support units 2 rotate by taking the first direction X as the rotation axis direction, an extension direction 212 of the second support of at least one support unit 2 may be no longer along the second direction Y, and the extension directions of the second support portions 212 of the adjacent two support units 2 intersect, so that the display device can adjust the display angle of each display screen unit 1 on the direction Y. In summary, the display device provided by the embodiments of the present disclosure can adjust the display angle of each display screen unit 1 in two intersecting directions.

In an embodiment, referring to FIGS. 1 to 7, the display device further includes a connector 3. The connector 3 includes a first connector 31 and a second connector 32. For the two support units 2 which are connected in the first direction X, the first support portion 211 of one support unit 2 of the two support units is connected to the first support portion 211 of the other support unit 2 of the two support units through the first connector 31. In the first direction X, the first support portions 211 of the adjacent two support units 2 are connected by the first connector 31. At least one support unit 2 is rotatable relative to the first connector 31. In an embodiment, the two support units 2 which are connected to the first connector 31 are rotationally connected to the first connector 31, and the two support units 2 which are connected to the first connector 31 are able to rotate relative to the first connector 31. In another embodiment, one support unit of the two support units 2 which are connected to the first connector 31 is rotationally connected to the first connector 31, and the other support unit of the two supporting units 2 which are connected to the first connector 31 is fixedly connected to the first connector 31, this support unit 2 is fixed to the first connector 31 and is not able to rotate relative to each other. For two support units 2 which are connected in the second direction Y, the second support portion 212 of one support unit 2 of the two support units is connected to the second support portion 212 of the other support unit 2 of the two support units through the second connector 32. In the second direction Y, the second support portions 212 of the adjacent two support units 2 are connected by the second connector 32. At least one support unit 2 is rotatable relative to the second connector 32. In an embodiment, the two support units 2 which are connected to the second connector 32 are rotationally connected to the second connector 32, and the two support units 2 which are connected to the second connector 32 are able to rotate relative to the second connector 32. In another embodiment, one support unit of the two support units 2 which are connected to the second connector 32 is rotationally connected to the second connector 32, and the other support unit of the two supporting units 2 which are connected to the second connector 32 is fixedly connected to the second connector 32, this support unit 2 is fixed to the second connector 32 and is not able to rotate relative to each other.

In an embodiment, referring to FIG. 4, the connector 3 includes a positioning hole 33. The support unit 2 also includes a first positioning column 24. The first positioning column 24 is sleeved in the positioning hole 33. In the embodiments of the present disclosure, the first positioning column 24 is sleeved in the positioning hole 33, and the positioning hole 33 is sleeved on an outer surface of the first positioning column 24, so that the relative rotation between the connector 3 and the support unit 2 is implemented by the rotation of the first positioning column 24 in the positioning hole 33. A position of the positioning hole 33 limits a position of a rotation axis. If the positioning hole 33 extends in the first direction X, the first direction X is the rotation axis direction. If the positioning hole 33 extends in the second direction Y, the second direction Y is the rotation axis direction In an embodiment, referring to FIG. 4, the positioning hole 33 is a through hole, that is, the positioning hole 33 is a hole penetrating a side wall of the connector 3. In other embodiments, the positioning hole 33 may also be a blind hole, that is, the positioning hole 33 is a hole not penetrating the side wall of the connector 3.

In an embodiment, referring to FIG. 4, the connector 3 includes a first side wall 301, a second side wall 302 and a third side wall 303 connected in sequence, where the first side wall 301 is opposite to the third side wall 303. The first side wall 301 is connected to the third side wall 303 through the second side wall 302. A side wall connecting the first side wall 301 and the third side wall 303 is not provided opposite the second side wall 302. The first side wall 301, the second side wall 302 and the third side wall 303 are connected in a C shape. An opening of the connector 3 faces a direction of the second side wall 302 facing away from the display screen unit 1. The positioning hole 33 is arranged in the first side wall 301 and the third side wall 303. In the embodiments of the present disclosure, the first side wall 301, the second side wall 302 and the third side wall 303 form the C-shaped opening, and the opening of the connector 3 faces the direction of the second side wall 302 facing away from the display screen unit 1. When the support unit 2 rotates relative to the connector 3, the support unit 2 may rotate around the first positioning column 24 in a direction of facing away from the display screen unit 1, that is, the support unit 2 may rotate around the positioning hole 33 in a direction of facing away from the display screen unit 1. The opening of the connector 3 defines not only a direction of the support unit 2 rotating around the first positioning column 24, but also a range of an angle at which the support unit 2 is rotatable relative to the connector 3.

In an embodiment, referring to FIGS. 1 to 7, the support unit 2 further includes an extension portion 22. The extension portion 22 includes a first extension portion 221 and a second extension portion 222. The first extension portion 221 is slidable connected to the first support portion 211 and are slidable relative to each other in the first direction X. Since the two support units 2 which are connected in the first direction X, after rotating by taking the second direction Y as the rotation axis direction, are able to rotate relative to each other, the extension direction of the first support portion 211 which initially extends in the first direction X may be changed, but regardless of how the extension direction of the first support portion 211 changes, the first extension portion 221 and the first support portion 211 are slidable relative to each other in the extension direction of the first support portion 211. The second extension portion 222 is slidable connected to the second support portion 212 and are slidable relative to each other in the second direction Y. Since the two support units 2 which are connected in the second direction Y, after rotating by taking the first direction X as the rotation axis direction, are able to rotate relative to each other, the extension direction of the second support portion 212 which initially extends in the second direction Y may be changed, but regardless of how the extension direction of the second support portion 212 changes, the second extension portion 222 and the second support portion 212 are slidable relative to each other in the extension direction of the second support portion 212. In the embodiments of the present disclosure, the support unit 2 further includes the extension portion 22. The extension portion 22 includes a first extension portion 221 and a second extension portion 222, the first extension portion 221 and the first support portion 211 slide relative to each other in the extension direction of the first support portion 211, so that the first extension portion 221 is able to extend a length of the first support portion 211 in the extension direction of the first support portion 211. The second extension portion 222 and the second support portion 212 slide relative to each other in the extension direction of the second support portion 212, so that the second extension portion 222 is able to extend a length of the second support portion 212 in the extension direction of the second support portion 212. The use of the extension portion may include:

firstly, in a process of assembling the adjacent support units 2 together, a distance between adjacent two display screen units 1 may be greater than zero, thereby facilitating the assembly of the support units 2. After the assembly of the support units 2 is completed, the distance between the adjacent display screen units 1 is adjusted by the extension portion 22 so that the distance between the adjacent display screen units 1 is zero; secondly, the extension portion 22 may also be used for adjusting the distance between the adjacent two display screen units 1, so as to implement different placement position relationships of the display screens; thirdly, after the adjacent display screen units rotate relatively, the relative position relationship between the extension portion and the support can be adjusted to implement the splice position of the display screens having an included angle position relationship.

In an embodiment, referring to FIGS. 1 to 7, the extension portion 22 is sleeved with the support portion 21. The support portion 21 may be inserted into the extension portion 22, and may slide relative to the extension portion 22 in the extension direction of the support portion 21, thereby changing an arm length. Alternatively, in another embodiment, the extension portion 22 may be inserted into the support portion 21. In the embodiments of the present disclosure, the first extension portion 221 is sleeved with the first support portion 211, and the first extension portion 221 and the first support portion 211 slide relative to each other in the extension direction of the first support portion 211, so that the first extension portion 221 is able to extend the length of the first support portion 211 in the extension direction of the first support portion 211. The second extension portion 222 is sleeved with the second support portion 212, and the second extension portion 222 and the second support portion 212 slide relative to each other in the extension direction of the second support portion 212, so that the second extension portion 222 is able to extend the length of the second support 211 in the extension direction of the second support portion 212. In other embodiments, the extension portion 22 and the support portion 21 can also be slidably connected in a manner in addition to being sleeved, which is not limited in the embodiments of the present disclosure.

In an embodiment, referring to FIGS. 1 to 7, the extension portion 22 includes an inner cavity and an elongated hole 223 communicating the inner cavity with the outside, and an extension direction of the elongated hole 223 is same as a sliding direction of the extension portion 22 relative to the support portion 21. An extension direction of the elongated hole 223 on the first extension portion 221 is same as a sliding direction of the first extension portion 221 relative to the first support portion 211. An extension direction of the elongated hole 222 on the second extension portion 221 is same as a sliding direction of the second extension portion 222 relative to the second support portion 212. The support portion 21 includes a support rod 213 and a second positioning column 214 which are fixedly connected to each other. The support rod 213 is inserted into the inner cavity of the extension portion 22, the second positioning column 214 is inserted into the elongated hole 223 of the extension portion 22, and in response to the extension portion 22 sliding relative to the support portion 21, the second positioning column 214 moves in the elongated hole 223. In the embodiments of the present disclosure, a first support rod 213 of the first support portion 211 is inserted into the inner cavity of the first extension portion 221, and the second positioning column 214 of the first support portion 211 is inserted into the elongated hole 223 of the first extension portion 221. In response to the first extension portion 221 sliding relative to the first support portion 211, the second positioning column 214 of the first support portion 211 moves within the elongated hole 223 of the first extension portion 221. The first support rod 213 of the second support portion 212 is inserted into the inner cavity of the second extension portion 222, and the second positioning column 214 of the second support portion 212 is inserted into the elongated hole 223 of the second extension portion 222. In response to the second extension portion 222 sliding relative to the second support portion 212, the second positioning column 214 of the second support portion 212 moves within the elongated hole 223 of the second extension portion 222. In the embodiments of the present disclosure, the elongated hole 223 on the second extension portion 222 provides a moving space for the second positioning column 214 of the support portion 21, and the second positioning column 214 of the support portion 21 is movable in the extension direction of the elongated hole 223 in the elongated hole 223 on the second extension portion 222, thereby limiting the sliding direction of the extension portion 22 relative to the support portion 21.

It is to be understood that, in another embodiment, the extension portion 22 may be inserted into the support portion 21. The supporting 21 includes an inner cavity and an elongated hole 223 communicating the inner cavity with the outside, an extension direction of the elongated hole 223 is same as a sliding direction of the extension portion 22 relative to the support portion 21. The extension portion 22 includes a first support rod 213 and a second positioning column 214 which are fixedly connected to each other. The support rod 213 of the extension portion 22 is inserted into the inner cavity of the support portion 21, the second positioning column 214 of the extension portion 22 is inserted into the elongated hole 223 of the support portion 21, and in response to the extension portion 22 sliding relative to the support portion 21, the second positioning column 214 moves in the elongated hole 223.

In an embodiment, one elongated hole 223 may be arranged on the extension portion 22.

In an embodiment, referring to FIGS. 1 to 7, at least two elongated holes 223 are included in the extension portion 22, and the at least two elongated holes 223 are arranged in a circumferential direction of the extension portion 22. That is, the number of elongated holes 223 provided on a side wall of each extension portion 22 is greater than or equal to two. At least two second positioning columns 214 are included by the support portion 21, and the at least two second positioning columns 214 one-to-one correspond to the at least two elongated holes 223. In the embodiments of the present disclosure, the number of elongated holes 223 provided on a side wall of the first extension portion 221 is greater than or equal to two, the number of second positioning columns 214 in the first support portion 211 is greater than or equal to two, the number of second positioning columns 214 in the first support portion 211 is equal to the number of elongated holes 223 in the first extension portion 221 which is sleeved with the first support portion 211, positions of the second positioning columns 214 in the first support portion 211 are matched with positions of the elongated holes 223 in the first extension portion 221 which is sleeved with the first support portion 211, and the second positioning columns 214 are inserted into the elongated holes 223 in the extension portion 22. The number of elongated holes 223 provided on a side wall of the second extension portion 222 is greater than or equal to two, the number of second positioning columns 214 in the second support portion 212 is greater than or equal to two, the number of second positioning columns 214 in the second support portion 212 is equal to the number of elongated holes 223 in the second extension portion 222 which is sleeved with the second support portion 212, positions of the second positioning columns 214 in the second support portion 212 are matched with positions of the elongated holes 223 in the second extension portion 222 which is sleeved with the second support portion 212, and the second positioning columns 214 are inserted into the elongated holes 223 in the extension portion 22. In the embodiments of the present disclosure, the at least two elongated holes 223 arranged in the circumferential direction of the extension portion 22 are matched with the at least two second positioning columns 214 in the support portion 21, so that the extension portion 22 slides in the extension direction of the support portion 21 relative to the support portion 21.

In an embodiment, referring to FIG. 4, four elongated holes 223 are included in the first extension portion 221, and the four elongated holes 223 are arranged in the circumferential direction of the first extension portion 221. Four second positioning columns 214 are included by the first support portion 211, and the second positioning columns 214 one-to-one correspond to the elongated holes 223. Four elongated holes 223 are included by the second extension portion 222, and the four elongated holes 223 are arranged in the circumferential direction of the second extension portion 222. Four second positioning columns 214 are included by the second support portion 212, and the second positioning columns 214 one-to-one correspond to the elongated holes 223.

In other embodiments, the number of second positioning columns 214 in the support portion 21 may be greater than the number of elongated holes 223 in the extension portion 22 which is sleeved with the support portion 21. One elongated hole 223 in the extension portion 22 may also be matched with at least two second positioning columns 214 in the support portion 21, so that the extension portion 22 slides relative to the support portion 21 in the extension direction of the support portion 21.

Figure 10:
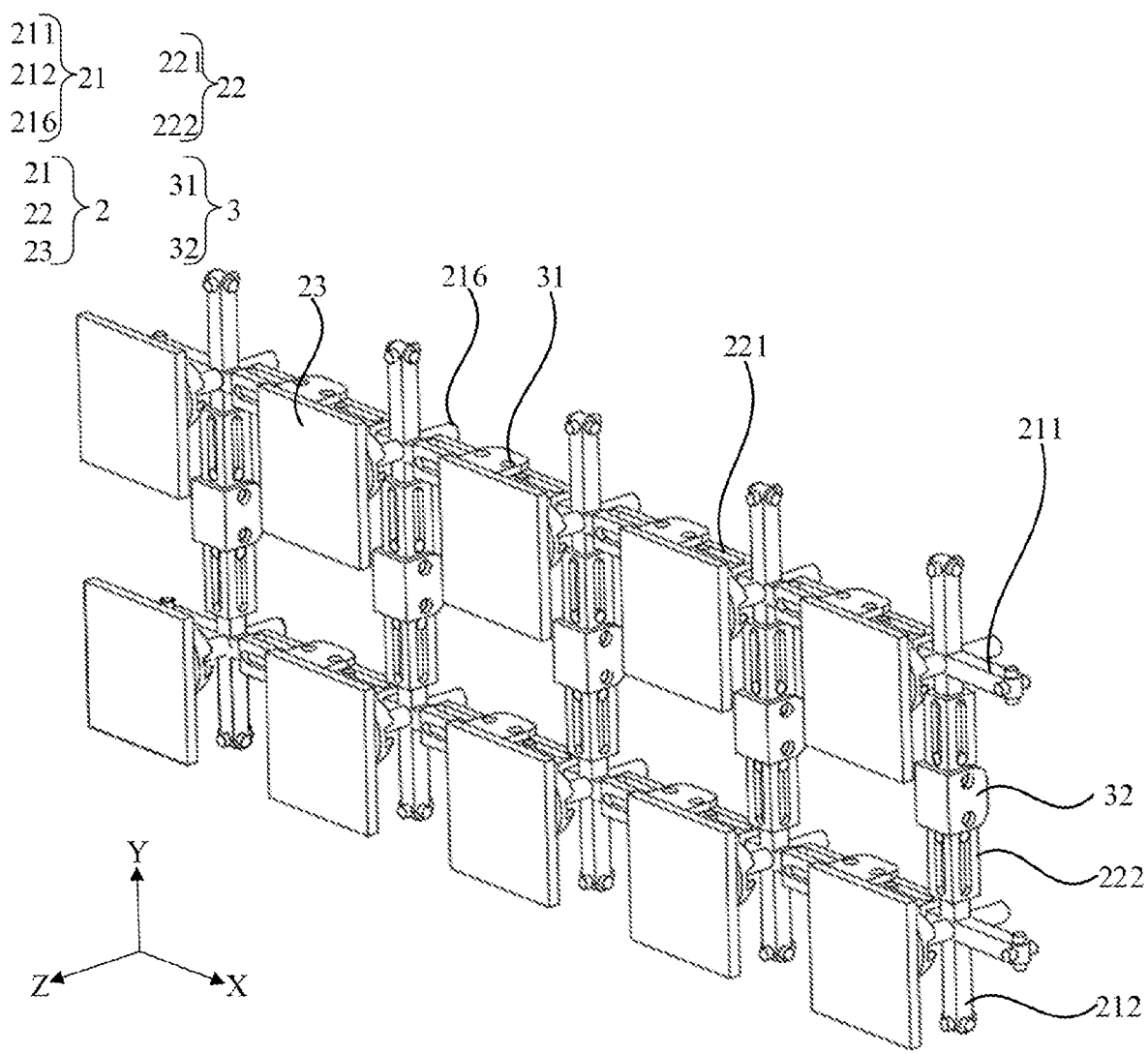
FIG. 10 is a schematic diagram of another display device in a frontal oblique viewing angle according to an embodiment of the present disclosure.

As shown in FIGS. 1 to 9, the display device includes, but is not limited to, four support units 2 and four display screen units 1, and the support units 2 in the display device can be infinitely expanded in the first direction X and/or the second direction Y. FIG. 10 is a schematic diagram of another display device in a frontal oblique viewing angle according to an embodiment of the present disclosure. Referring to FIG. 10, to facilitate observing the structure of the support unit 2, a display screen unit 1 is omitted in the display device shown in FIG. 10. On the basis of the above embodiments, the display device shown in FIG. 10 is expanded in a first direction X, support units 2 are added in the first direction X, so that display screen units 1 fixed by the support units 2 are added correspondingly. The first support part 211 in the original support unit 2 is connected to the first support portion 211 in the newly added support unit 2 through a first connector 31, so that the number of support units 2 in the first direction X is expanded from two to five. It is to be understood that, in another embodiment, or based on the above embodiments, the display device shown in FIG. 10 is expanded in a second direction Y, support units 2 are added in the second direction Y, so that display screen units 1 fixed by the support units 2 are added correspondingly. The second support portion 212 in the original support unit 2 is connected to the second support portion 212 in the newly added support unit 2 through a second connector 32, so that the number of support units 2 in the second direction Y is expanded from two to five.

Figure 11:
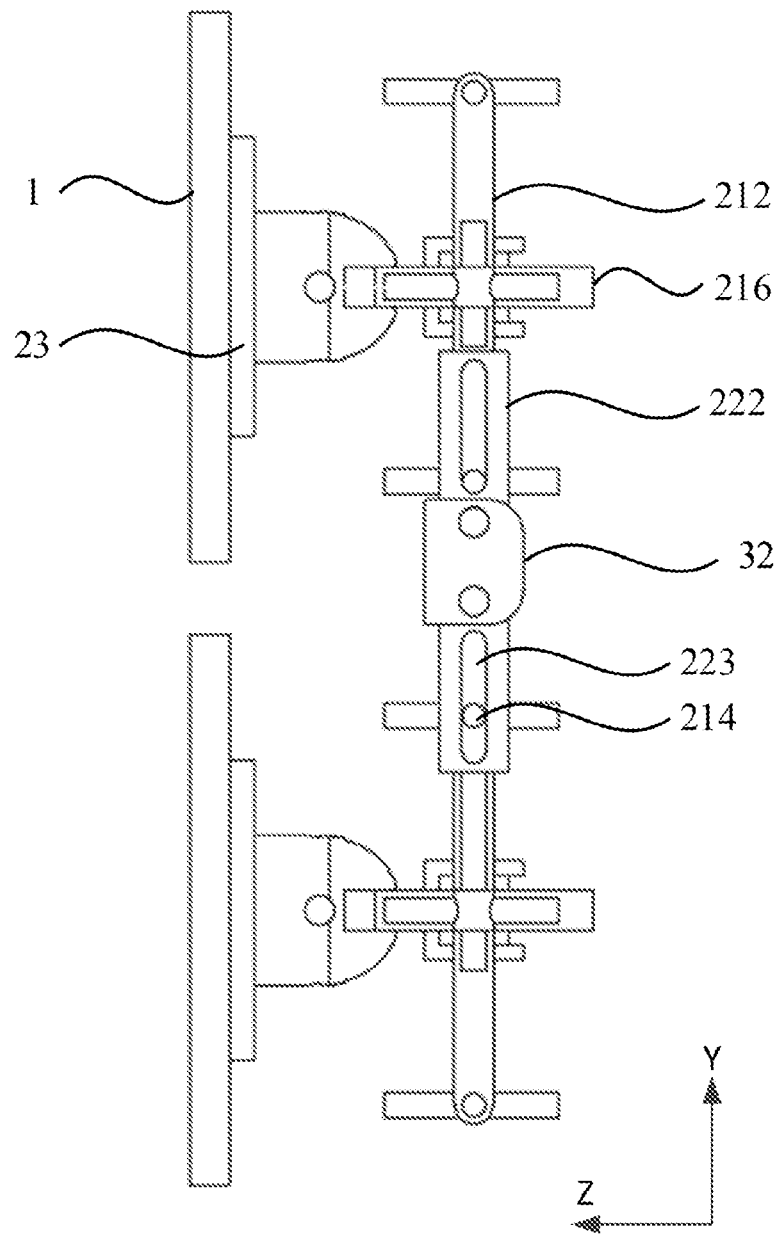
FIG. 11 is a schematic diagram after an extension portion slides relative to a support portion in the display device shown in FIG. 6.

FIG. 11 is a schematic diagram after an extension portion slides relative to a support in the display device shown in FIG. 6. Referring to FIGS. 6 and 11, as shown in FIG. 6, the second positioning column 214 is located in the elongated hole 223. In the second direction Y, the second positioning column 214 is located at one end of the elongated hole 223 adjacent to the second connector 32. In this case, adjacent two display screen units 1 in the second direction Y are in contact, and the adjacent two display screen units 1 in the second direction Y are spliced into a large-size display screen. As shown in FIG. 11, one of the second positioning columns 214 moves in a direction facing away from the second connector 32, a sum of lengths of the second extension portion 222 and the second support portion 212 corresponding to the second positioning columns 214 increases, and the adjacent two display screen units 1 in the second direction Y are separated. In this way, a distance between the adjacent two display screen units 1 in the second direction Y may be adjusted by sliding the second extension portion 222 relative to the second support portion 212. Similarly, a distance between the adjacent two display screen units 1 in the first direction X may also be adjusted by sliding the first extension portion 221 relative to the first support portion 211.

In an embodiment, referring to FIGS. 6 and 11, in an embodiment, the second positioning column 214 is located at one end of the elongated hole 223 adjacent to the second connector 32, and the adjacent two display screen units 1 in the second direction Y are in contact, in this case, a position of the second positioning column 214 may be taken as an initial position of the second positioning column 214, i.e., a zero point. In another embodiment, the second positioning column 214 is located at one end of the elongated hole 223 facing away from the second connector 32, in this case, the position of the second positioning column 214 may be taken as the initial position of the second positioning column 214. In another embodiment, any position between the two ends of the elongated hole 223 may also be taken as the initial position of the second positioning column 214.

Figure 12:
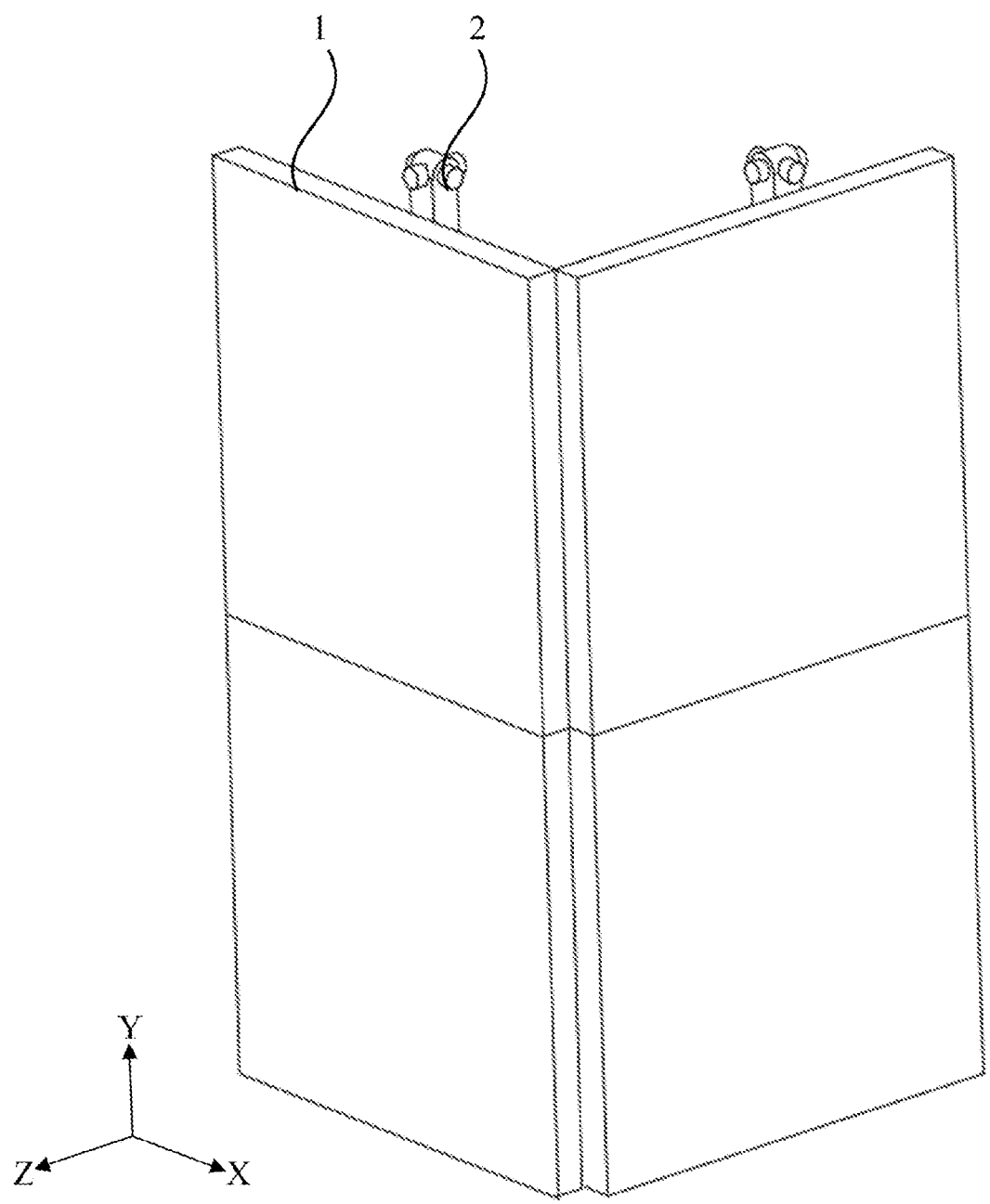
FIG. 12 is a schematic diagram after an extension portion slides relative to a support portion in the display device shown in FIG. 8.

FIG. 12 is a schematic diagram after an extension portion slides relative to a support in the display device shown in FIG. 8. Referring to FIGS. 8 and 12, as shown in FIG. 8, the two supporting units 2 which are connected in the first direction X are able to rotate relative to each other by taking the second direction Y as the rotation axis direction. A gap exists between the adjacent two display screen units 1 in the second direction Y. Since an arm length can be adjusted by sliding the first extension portion 221 relative to the first support portion 211, a position of the display screen unit 1 can be adjusted. Therefore, after the two support units 2 which are connected in the first direction X are rotated relative to each other, the adjacent two display screen units 1 in the first direction X may be in contact by sliding the first extension portion 221 relative to the first support portion 211, thereby forming the display device as shown in FIG. 12, i.e., implementing the seamless splice. Similarly, after the two support units 2 which are connected in the second direction Y are rotated relative to each other, the adjacent two display screen units 1 in the second direction Y may be in contact by sliding the second extension portion 222 relative to the second support portion 212, thereby implementing the seamless splice.

Furthermore, after two support units 2 which are connected in the first direction X are rotated relative to each other and the adjacent two display screen units 1 are seamlessly spliced, multiple display screen units 1 may jointly form a large-size display screen having a curved surface.

Figure 13:
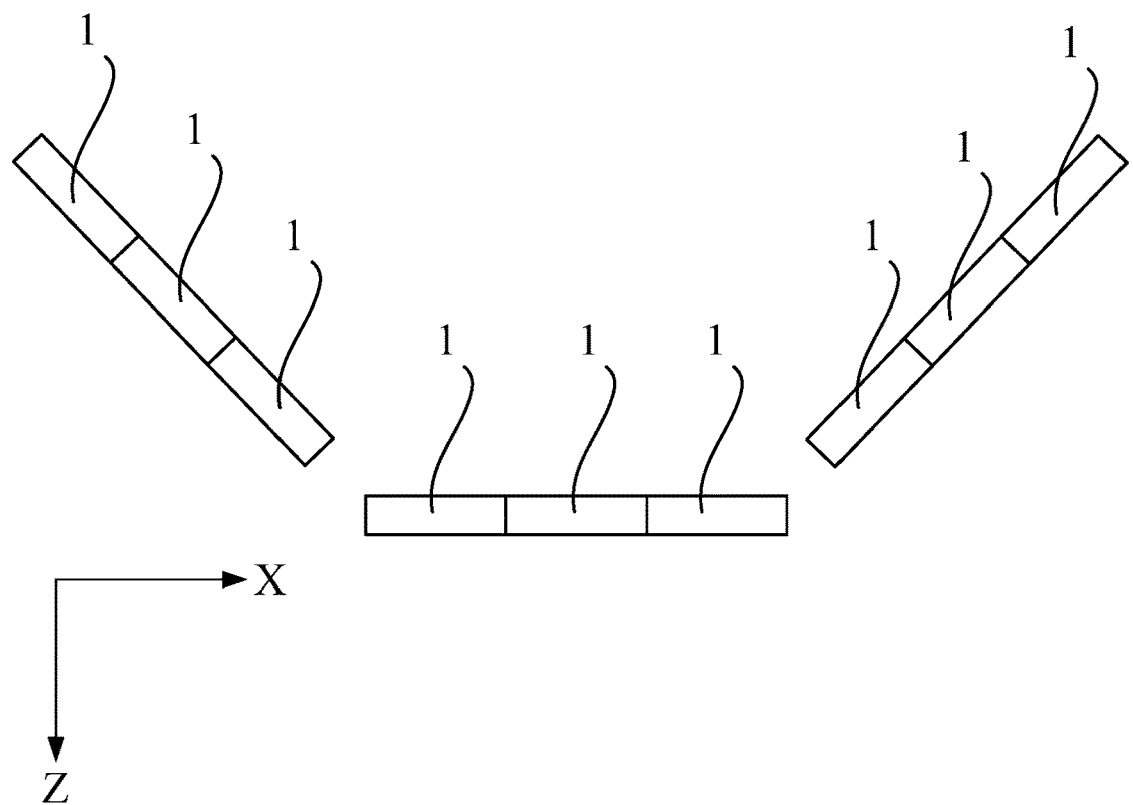
FIG. 13 is a top view of another display device according to an embodiment of the present disclosure.

FIG. 13 is a top view of another display device according to an embodiment of the present disclosure. Referring to FIG. 13, among multiple display screen units 1 arranged in a row in a first direction X, a case where adjacent two display screen units 1 are coplanarly spliced exists, and a case where adjacent two support units 2 are relatively rotated by taking the second direction Y as the rotation axis direction and the adjacent two display screen units 1 are not coplanar also exists, that is, the adjacent two display screen units 1 have different orientations. Therefore, the display screen units 1 which are not coplanar after rotation provide different viewing angles. The relative rotation between two adjacent support units 2 may be referred to the above embodiments and repetition will not be made in the present embodiment.

Figure 14:
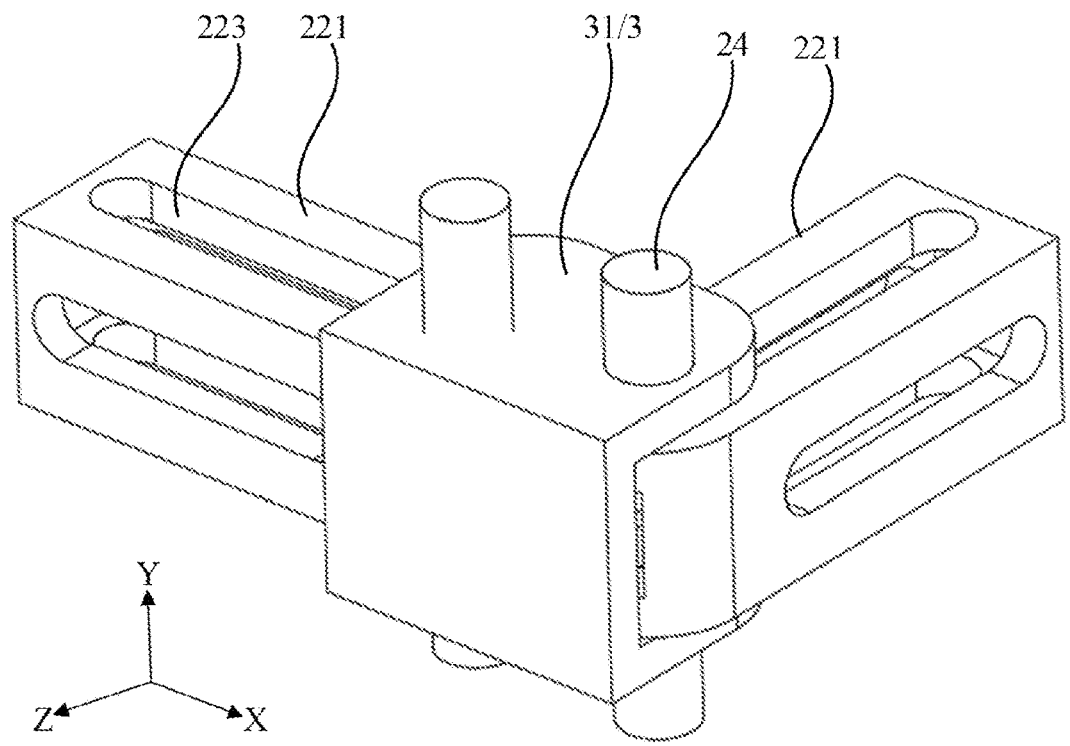
FIG. 14 is a schematic diagram of a connector according to an embodiment of the present disclosure.

FIG. 14 is a schematic diagram of a connector according to an embodiment of the present disclosure. Referring to FIGS. 4 and 14, the support unit 2 further includes an extension portion 22. The extension portion 22 includes a first extension portion 221 and a second extension portion 222. The display device further includes a connector 3. The connector 3 includes a first connector 31 and a second connector 32. For the two support units 2 which are connected in the first direction X, the first extension portion 221 of one support unit 2 of the two support units is connected to the first extension portion 221 of the other support unit 2 of the two support units through the first connector 31. For the two support units 2 which are connected in the second direction Y, the second extension portion 222 of one support unit 2 of the two support units is connected to the second extension portion 222 of the other support unit 2 of the two support units through the second connector 32. The support unit 2 also includes the first positioning column 24. The first positioning column 24 may be arranged at one end of the extension portion 22 (including the first extension portion 221 and the second extension portion 222). It is to be understood that in a case where the extension portion 22 is not arranged, the first positioning column 24 may be arranged at one end of the support portion 21, and the support portion 21 of one support unit 2 may be connected to the support portion 21 of the other support unit 2 by the connector 3.

Figure 15:
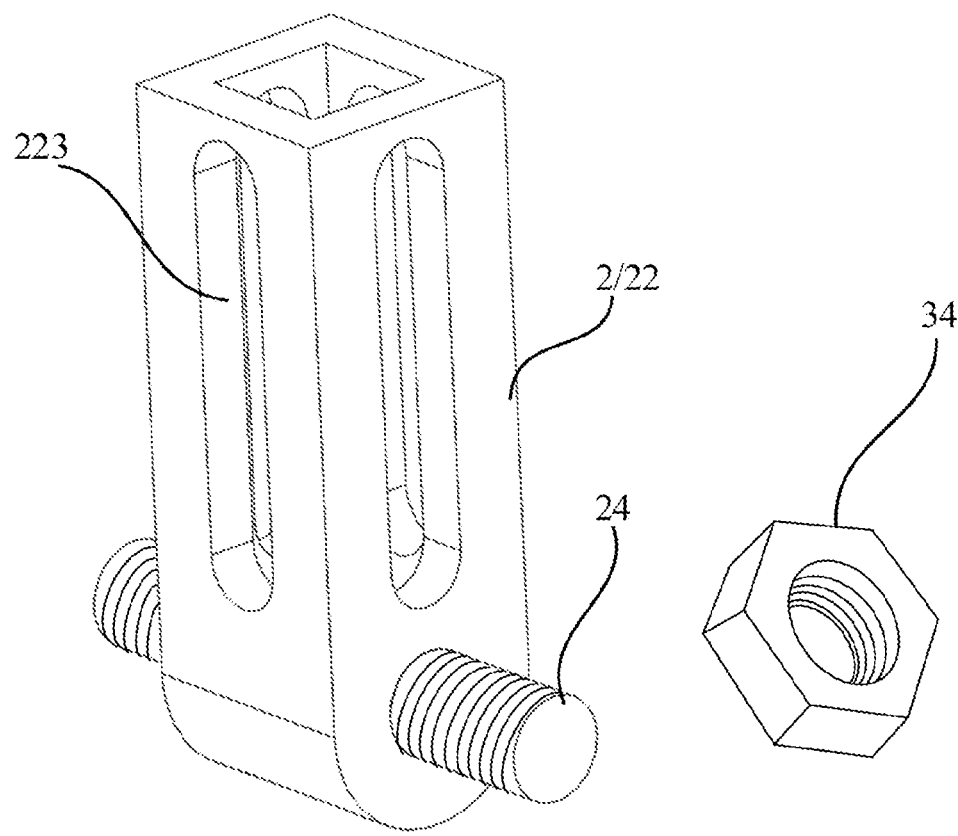
FIG. 15 is a schematic diagram of a first locking nut together with a first positioning column according to an embodiment of the present disclosure.

As shown in FIGS. 1 to 14, the first positioning column 24 is sleeved in the positioning hole 33, so that the relative rotation between the connector 3 and the support unit 2 is implemented by the rotation of the first positioning column 24 in the positioning hole 33. After the first positioning column 24 is rotated to a preset angle, the connector 3 and the support unit 2 may also be fixed. FIG. 15 is a schematic diagram of a first locking nut together with a first positioning column according to an embodiment of the present disclosure. Referring to FIGS. 1 to 15, an end of the first positioning column 24 is provided with an external thread. The connector 3 further includes a first locking nut 34. The first locking nut is threaded with the first positioning column 24. In an embodiment of the present disclosure, the first positioning column 24 may pass through the positioning hole 33 and extend from between the first side wall 301 and the third side wall 303 to one side of the first side wall 301 facing away from the third side wall 303, or from between the first side wall 301 and the third side wall 303 to one side of the third side wall 303 facing away from the first side wall 301. That is, the first positioning column 24 may extend from the inside of the opening of the connector 3 to the outside of the opening of the connector 3, and a part of the first positioning column 24 extending to the outside of the opening of the connector 3 is threaded with the first locking nut 34, so that the connector 3 is fixed to the support unit 2.

In an embodiment, the support unit 2 further includes a second fixed member (not shown in FIGS. 1 to 15), and the second fixed member is configured to fix the extension portion 22 relative to the support portion 21.

In an embodiment, referring to FIGS. 1 to 15, the second positioning column 214 may pass through the elongated hole 223 and extend from the inner cavity of the extension portion 22 to the outside of the extension portion 22, and a part of the second positioning column 214 extending to the outside of the extension portion 22 may be connected to the locking nut in a threaded connection manner, so that the extension portion 22 is fixed to the support portion 21.

Figure 16:
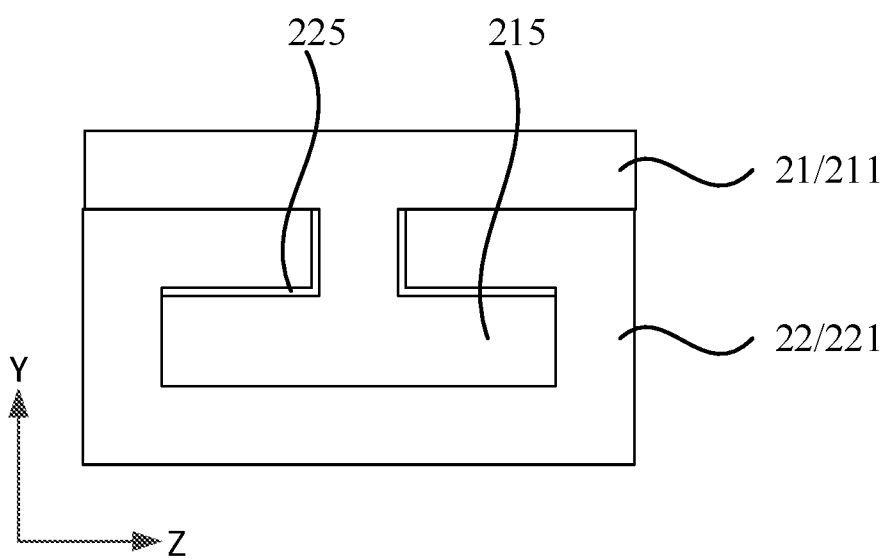
FIG. 16 is a schematic diagram illustrating that another extension portion is slidably connected to a support portion according to an embodiment of the present disclosure.

FIG. 16 is a schematic diagram illustrating that another extension portion is slidably connected to a support according to an embodiment of the present disclosure. Referring to FIG. 16, the support portion 21 and the extension portion 22 may be slidably connected in a manner of engaging a slide rail with a slide way. The support portion 21 includes a slide block 215, and the extension portion 22 includes a slide rail 225. The slide block 215 of the support portion 21 is embedded in the slide rail 225 of the extension portion 22, and the slide block 215 of the support portion 21 is slidable relative to the slide rail 225 of the extension portion 22 in an extension direction of the support portion 21, thereby enabling the support portion 21 to slide relative to the extension portion 22 in the extension direction of the support portion 21, thereby changing the arm length. In other embodiments, the support portion 21 includes the slide rail 225, and the extension portion 22 includes the slide block 215, the slide block 215 of the extension portion 22 is embedded within the slide rail 225 of the support portion 21.

In an embodiment, referring to FIGS. 1 to 7, the first direction X and the second direction Y are perpendicular to each other. The display device provided by the embodiment of the present disclosure can adjust the display angle of each display screen unit 1 in two intersecting directions.

In an embodiment, referring to FIGS. 1 to 7, the support portion 21 further includes a third support portion 216. The third support portion 216 extends in a third direction Z. The third support portion 216 is connected to the display screen unit 1. The support unit 2 provides support for the display screen unit 1 through the third support portion 216. The third direction Z is perpendicular to a plane defined by the first direction X and the second direction Y. The third direction Z is perpendicular to the first direction X, and the third direction Z is perpendicular to the second direction Y.

Figure 17:
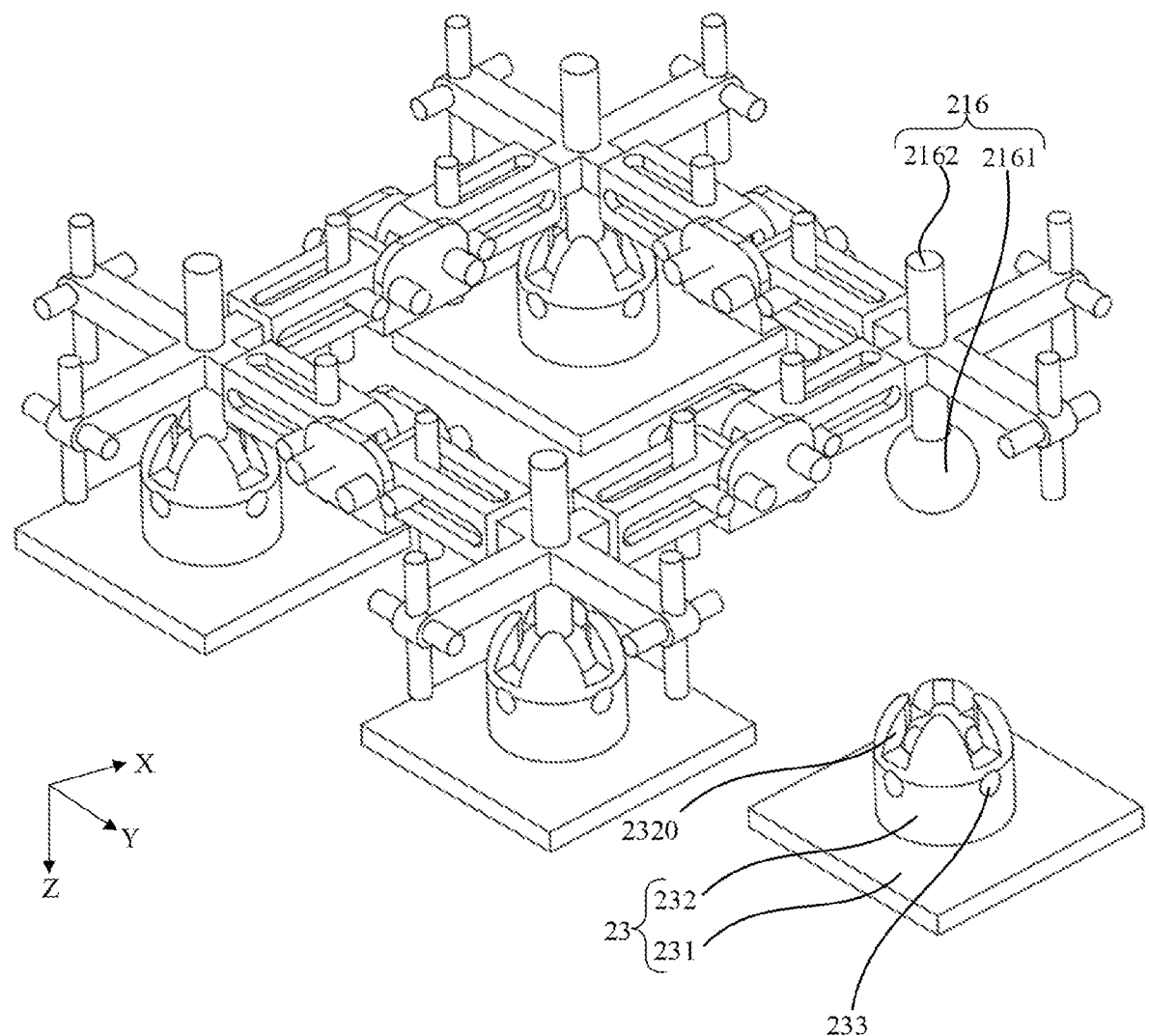
FIG. 17 is an exploded diagram of a display device shown in FIG. 1 in a rear oblique viewing angle.

FIG. 17 is an exploded diagram of a display device shown in FIG. 1 in a rear oblique viewing angle. Referring to FIGS. 1 to 7, and 17, the support unit 2 further includes a base 23. The base 23 includes a fixed plate 231 and a positioning slot 232 fixed on one side of the fixed plate 231. The fixed plate 231 is fixedly connected to the display screen unit 1. The display screen unit 1 is fixed to one side of the fixed plate 231 facing away from the positioning slot 232, and the positioning slot 232 and the display screen unit 1 are fixed to two opposite sides of the fixed plate 231. The third support portion 216 includes a plug 2161. The plug 2161 is fitted and inserted into the positioning slot 232. The plug 2161 is rotatable relative to the positioning slot 232. In the embodiments of the present disclosure, the plug 2161 is rotatable relative to the positioning slot 232, so that the display screen unit 1 is rotatable relative to the third support portion 216, and the display screen unit 1 is rotatable relative to the support unit 2. In other embodiments, the plug 2161 is fitted and inserted into the positioning slot 232, the plug 2161 may be fixed relative to the positioning slot 232, and the plug 2161 cannot rotate relative to the positioning slot 232.

In an embodiment, referring to FIGS. 1 to 7, and 17, the plug 2161 is spherical in shape. A radius of an opening on one side of the positioning slot 232 facing away from the fixed plate 231 is smaller than a radius of the plug 2161. The positioning slot 232 wraps and fixes the spherical plug 2161, and the spherical plug 2161 cannot be detached from the positioning slot 232, thus ensuring the connection stability between the plug 2161 and the positioning slot 232. Furthermore, in the embodiments of the present disclosure, the plug 2161 is spherical in shape, and the plug 2161 can be rotated within a range of 360° relative to the positioning slot 232, and a range of the rotation angle is relatively wide. In other embodiments, the plug 2161 may also be in another shape in addition to the spherical shape, and may be rotationally connected to the positioning slot 232 in a manner of a positioning pin, a hinge or the like.

Figure 18:
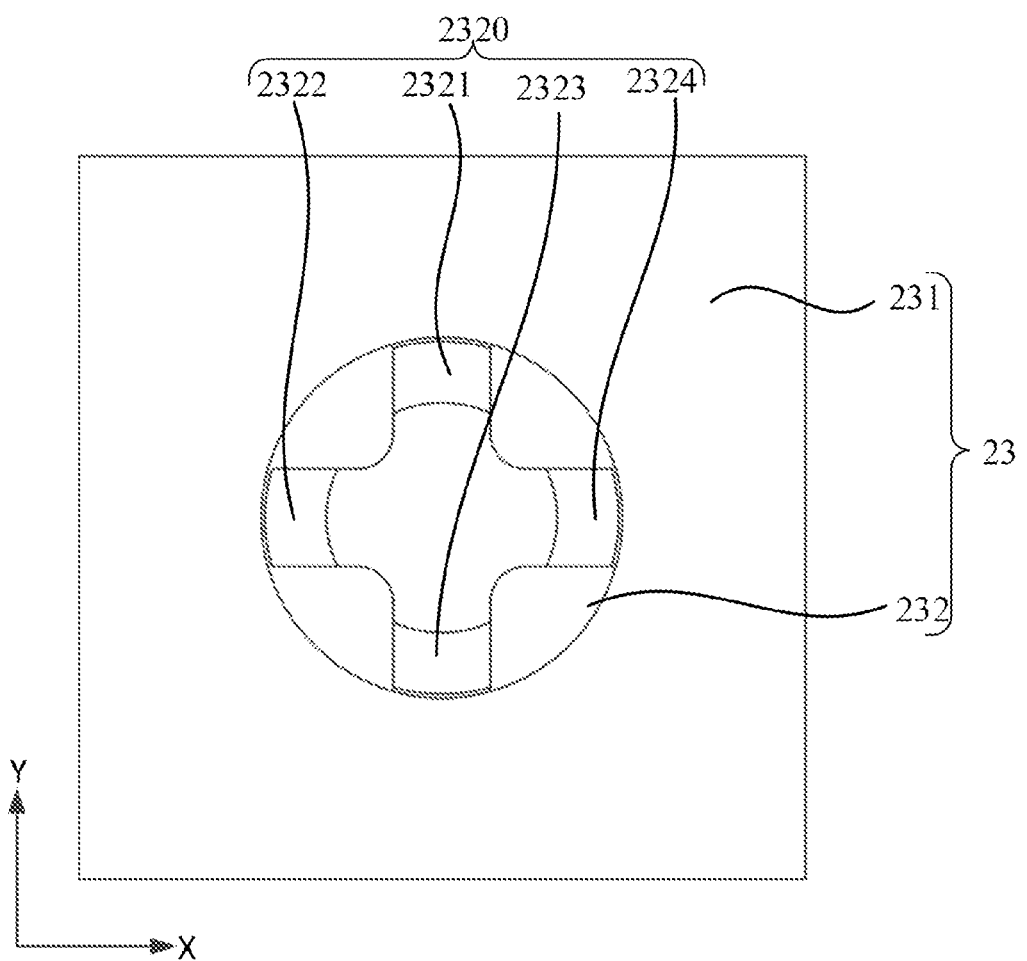
FIG. 18 is a schematic diagram of a base according to an embodiment of the present disclosure.

FIG. 18 is a schematic diagram of a base according to an embodiment of the present disclosure. Referring to FIGS. 17 and 18, the third support portion 216 further includes a support body 2162, and at least one stop slot 2320 is provided on a surface of the positioning slot 232, and a width of the stop slot 2320 is larger than a width of the support body 2162. In the embodiments of the present disclosure, the width of the stop slot 2320 is larger than the width of the support body 2162, the plug 2161 rotates relative to the positioning slot 232, and after the support body 2162 is embedded in the stop slot 2320, the stop slot 2320 restricts the movement of the support body 2162 in a plane parallel to the fixed plate 231, so that the stop slot 2320 is able to fix a relative position of the plug 2161 and the positioning slot 232 in a plane parallel to the fixed plate 231. In other embodiments, the spherical plug 2161 and the positioning slot 232 may also be fixed in other ways. For example, the third support portion 216 includes a fixed ring. The fixed ring is sleeved outside the positioning slot 232 and is threaded with the positioning slot 232. The fixed ring is rotated, so that the adhesion degree between the positioning slot 232 and the plug 2161 can be adjusted, thus the relative position between the plug 2161 and the positioning slot 232 is fixed.

In an embodiment, referring to FIGS. 17 and 18, at least one stop slot 2320 includes a first stop slot 2321, a second stop slot 2322, a third stop slot 2323 and a fourth stop slot 2324, the first stop slot 2321 is opposite to the third stop slot 2323, the second stop slot 2322 is opposite to the fourth stop slot 2324. In a circumferential direction of the positioning slot 232, the first stop slot 2321, the second stop slot 2322, the third stop slot 2323, and the fourth stop slot 2324 are arranged sequentially, and a connection direction from the first stop slot 2321 to the third stop slot 2323 is perpendicular to a connection direction from the second stop slot 2322 to the fourth stop slot 2324. In the embodiments of the present disclosure, four stop slots 2320 are provided on a surface of the positioning slot 232, which are the first stop slot 2321, the second stop slot 2322, the third stop slot 2323 and the fourth stop slot 2324 respectively, so that the plug 2161 rotates relative to the positioning slot 232, and the support body 2162 may be embedded in any one of the first stop slot 2321, the second stop slot 2322, the third stop slot 2323 and the fourth stop slot 2324.

Figure 19:
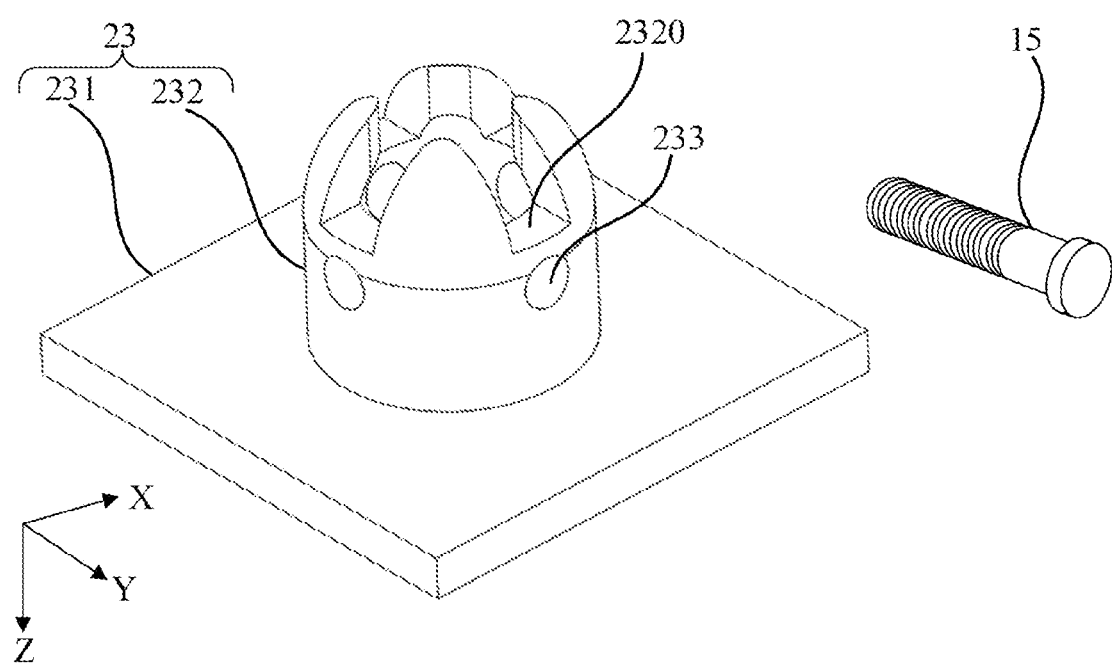
FIG. 19 is a schematic diagram of a first locking nut together with a first threaded hole according to an embodiment of the present disclosure.

FIG. 19 is a schematic diagram of a first locking nut together with a first threaded hole according to an embodiment of the present disclosure. Referring to FIGS. 17 to 19, a surface of the positioning slot 232 is further provided with a first threaded hole 233, and the first threaded hole 233 is communicated with an inner cavity of the positioning slot 232. The support unit 2 further includes a first locking screw 15. The first locking screw 15 is threaded with the first threaded hole 233. In the embodiment of the present disclosure, the plug 2161 is rotated relative to the positioning slot 232, no matter whether the stop slot 2320 is provided on the surface of the positioning slot 232, the first locking screw 15 can abut against the plug 2161 by screwing the first locking screw 15 into the first threaded hole 233, thus the plug 2161 and the positioning slot 232 are fixed.

Furthermore, referring to FIGS. 17 to 19, at least two first threaded holes 233 may be provided on the surface of the positioning slot 232 to enhance the stable degree of the plug 2161 and the positioning slot 232 when fixed. In an embodiment, the surface of the positioning slot 232 may be provided with four first threaded holes 233, and of course, the surface of the positioning slot 232 may also be provided with three or more than four first threaded holes 233.

Figure 20:
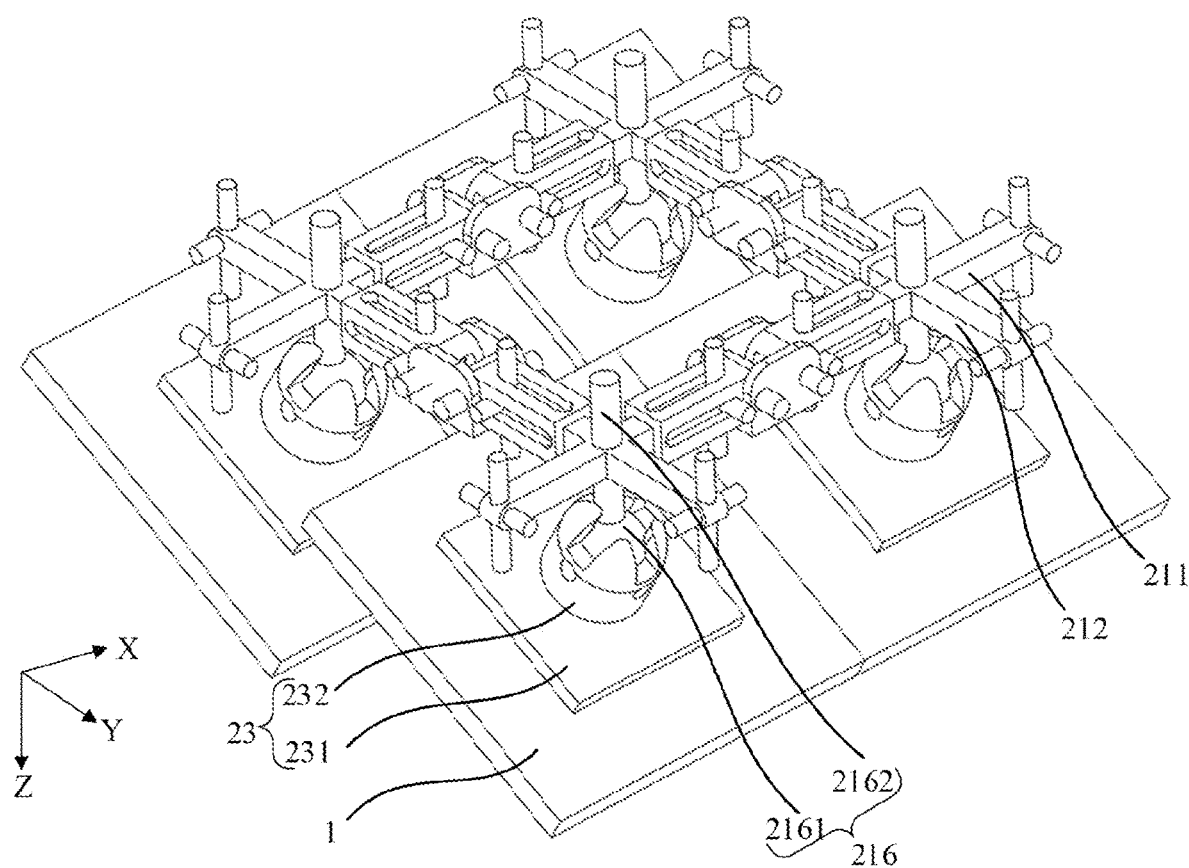
FIG. 20 is a schematic diagram after a plug rotates relative to a positioning slot in the display device shown in FIG. 1.
Figure 21:
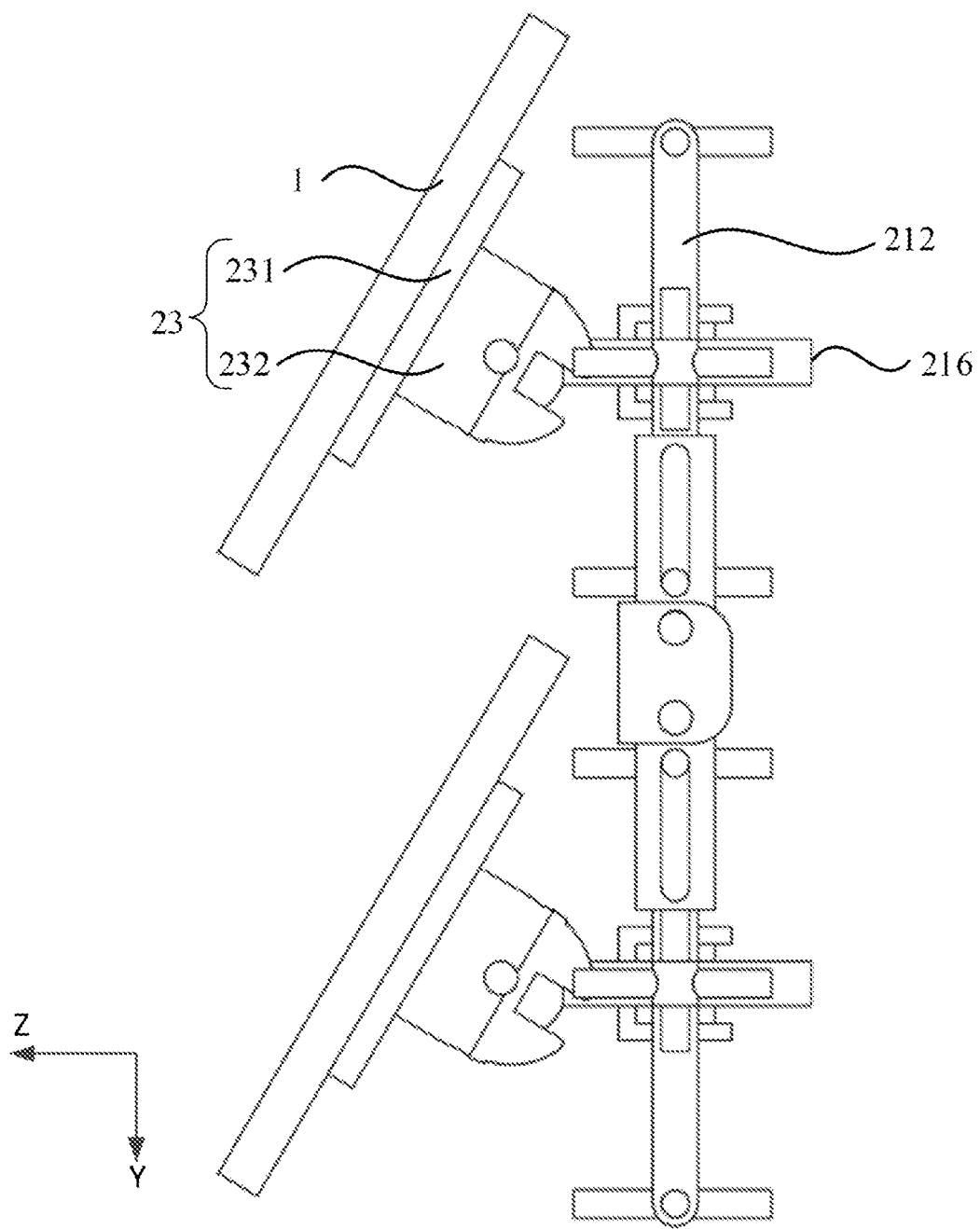
FIG. 21 is a side schematic diagram of a display device shown in FIG. 20.
Figure 22:
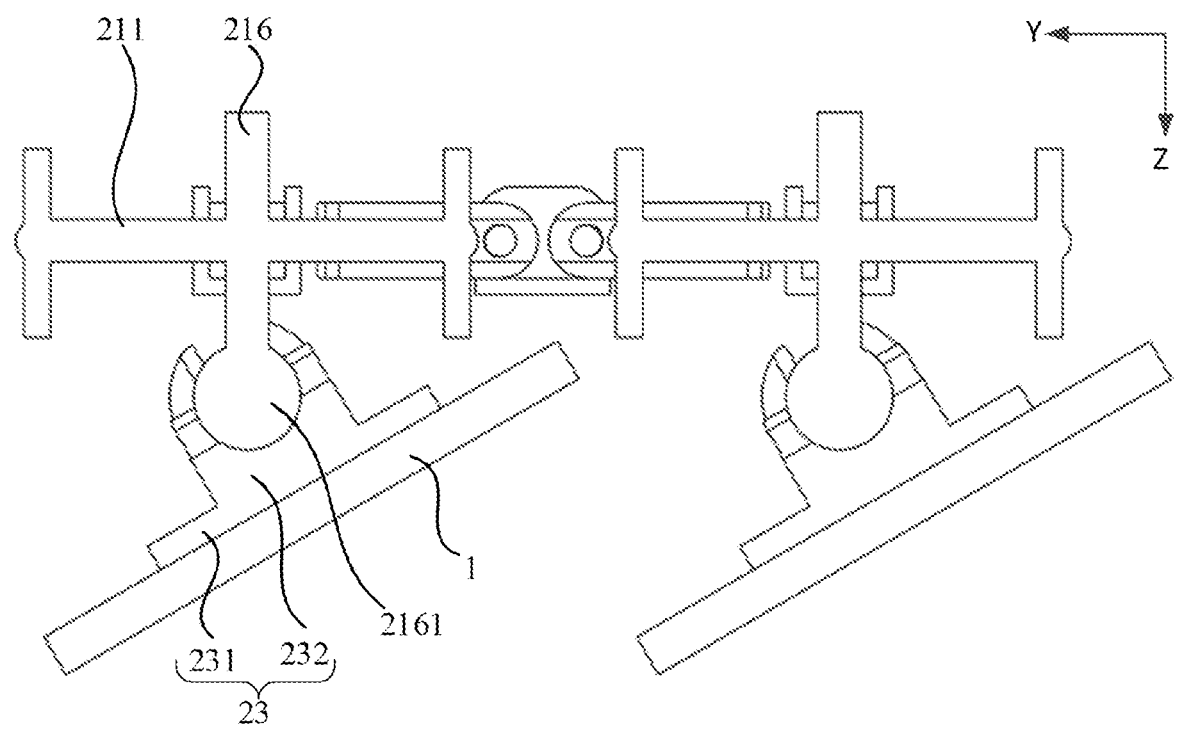
FIG. 22 is a sectional view of a display device shown in FIG. 20.

FIG. 20 is a schematic diagram after a plug rotates relative to a positioning slot in the display device shown in FIG. 1. FIG. 21 is a side schematic diagram of a display device shown in FIG. 20. FIG. 22 is a sectional view of a display device shown in FIG. 20. Referring to FIGS. 1 to 7 and 20 to 22, the plug 2161 of the third support portion 216 is fitted and inserted into the positioning slot 232, the plug 2161 rotates relative to the positioning slot 232, and the positioning slot 232 drives the display screen unit 1 on the fixed plate 231 to rotate relative to the third support portion 216, thus the display screen unit 1 further rotates relative to the support unit 2.

In an embodiment, referring to FIGS. 1 to 7, the support unit 2 further includes an extension portion 22. The extension portion 22 includes a third extension portion (not shown in FIGS. 1 to 7), and the third extension portion is slidably connected to the third support portion 216 and are slidable relative to each other in the third direction Z. The arrangement of the first extension portion 221 and the first support portion 211 may be applied to the design of the third extension portion, or the arrangement of the second extension portion 222 and the second support portion 212 may be applied to the design of the third extension portion and repetition will not be made here.

Referring to FIGS. 1 to 7, the first support portion 211, the second support portion 212, and the third support portion 216 form an integral structure. The first support portion 211, the second support portion 212, and the third support portion 216 may be made by a same material and formed in a same process or in a same mold. Since the first support portion 211, the second support portion 212 and the third support portion 216 form the integral structure, the first support portion 211, the second support portion 212, and the third support portion 216 are formed integrally, so that the connection soundness between any two of the first support portion 211, the second support portion 212, and the third support portion 216 is increased, thereby improving the soundness of the support portion 21 and the ability of withstanding the pressure of the support portion 21.

It is to be noted that the preceding are only preferred embodiments of the present disclosure and the technical principles used therein. It is to be understood by those skilled in the art that the present disclosure is not limited to the embodiments described herein. For those skilled in the art, various apparent modifications, adaptations, combinations, and substitutions can be made without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. A display device, comprising:
   a plurality of display screen units; and
   a plurality of support units, wherein the plurality of support units is configured to support the plurality of display screen units;
   wherein two support units connected in a first direction of the plurality of support units are rotatable relative to each other with a second direction as a rotation axis direction, and the first direction intersects the second direction,
   wherein two support units connected in the second direction of the plurality of support units are rotatable relative to each other with the first direction as a rotation axis direction, and
   a support unit of the plurality of support units comprises a support portion, the support portion comprises a first support portion and a second support portion, the first support portion extends in the first direction, the second support portion extends in the second direction.

2. The display device of claim 1, further comprising:
   a connector, wherein the connector comprises a first connector and a second connector; and wherein,
   for the two support units connected in the first direction, a first support portion of one support unit of the two support units is connected to a first support portion of another support unit of the two support units through the first connector, and at least one support unit of the two support units is rotatable relative to the first connector; and
   for the two support units connected in the second direction, a second support portion of one support unit of the two support units is connected to a second support portion of another support unit of the two support units through the second connector, and at least one support unit of the two support units is rotatable relative to the second connector.

3. The display device of claim 2, wherein
   the connector comprises a positioning hole; and
   the support unit further comprises a first positioning column, wherein the first positioning column is sleeved in the positioning hole.

4. The display device of claim 3, wherein the connector comprises a first side wall, a second side wall and a third side wall connected in sequence, and wherein the first side wall is opposite to the third side wall, and an opening of the connector facing a direction of the second side wall facing away from the plurality of display screen units; and
   wherein the positioning hole is arranged in the first side wall and the third side wall.

5. The display device of claim 3, wherein an end of the first positioning column is provided with an external thread; and
   wherein the connector further comprises a first locking nut, and the first locking nut is threaded with the first positioning column.

6. The display device of claim 1, wherein the support unit also comprises an extension portion, and wherein the extension portion comprises a first extension portion and a second extension portion, the first extension portion and the first support portion are slidably connected and are slidable relative to each other in the first direction, and the second extension portion and the second support portion are slidably connected and are slidable relative to each other in the second direction.

7. The display device of claim 6, wherein the extension portion is sleeved with the support portion.

8. The display device of claim 7, wherein the extension portion comprises an inner cavity and an elongated hole communicating the inner cavity with an outside of the extension portion, and an extension direction of the elongated hole is same as a sliding direction of the extension portion relative to the support portion; and
wherein the support portion comprises a support rod and a second positioning column which are fixedly connected to each other, the support rod is inserted into the inner cavity of the extension portion, the second positioning column is inserted into the elongated hole of the extension portion, and in response to the extension portion sliding relative to the support portion, the second positioning column moves in the elongated hole.

9. The display device of claim 8, wherein at least two elongated holes are provided in the extension portion, and the at least two elongated holes are arranged in a circumferential direction of the extension portion; and
wherein at least two second positioning columns are provided in the support portion, and the at least two second positioning columns are arranged in a one-to-one correspondence with the at least two elongated holes.

10. The display device of claim 7, wherein the support unit further comprises a second fixed member, wherein the second fixed member is configured to fix the extension portion relative to the support portion.

11. The display device of claim 1, wherein the first direction and the second direction are perpendicular to each other.

12. The display device of claim 1, wherein
the support portion further comprises a third support portion extending in a third direction; and
the third support portion is connected to a display screen unit of the plurality of display screen units, and the third direction is perpendicular to a plane defined by the first direction and the second direction.

13. The display device of claim 12, wherein
the support unit further comprises a base, wherein the base comprises a fixed plate and a positioning slot fixed on a side of the fixed plate;
the fixed plate is fixedly connected to the display screen unit; and
the third support portion comprises a plug, and the plug is fitted and inserted into the positioning slot and is rotatable relative to the positioning slot.

14. The display device of claim 13, wherein
the plug is spherical in shape; and
a radius of an opening on a side of the positioning slot facing away from the fixed plate is smaller than a radius of the plug.

15. The display device of claim 13, wherein
the third support portion further comprises a support body, and the plug is located at an end of the support body; and
a surface of the positioning slot is provided with at least one stop slot, and a width of the at least one stop slot is larger than a width of the support body.

16. The display device of claim 15, wherein the at least one stop slot comprises a first stop slot, a second stop slot, a third stop slot and a fourth stop slot, the first stop slot is opposite to the third stop slot, the second stop slot is opposite to the fourth stop slot, and a connection direction from the first stop slot to the third stop slot is perpendicular to a connection direction from the second stop slot to the fourth stop slot.

17. The display device of claim 13, wherein
a surface of the positioning slot is further provided with a first threaded hole, and the first threaded hole is communicated with an inner cavity of the positioning slot; and
the support unit further comprises a first locking screw, and the first locking screw is threaded with the first threaded hole.

18. The display device of claim 12, wherein the support unit further comprises an extension portion, the extension portion comprises a third extension portion, and the third extension portion and the third support portion are slidably connected and are slidable relative to each other in the third direction.

19. The display device of claim 12, wherein the first support portion, the second support portion and the third support portion form an integral structure.

* * * * *